US012666987B2

(12) United States Patent
Hoang

(10) Patent No.: US 12,666,987 B2
(45) Date of Patent: Jun. 23, 2026

(54) SEMICONDUCTOR APPARATUS

(71) Applicant: ROHM CO., LTD., Kyoto (JP)

(72) Inventor: Tan Nhat Hoang, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 755 days.

(21) Appl. No.: 18/005,806

(22) PCT Filed: Sep. 2, 2021

(86) PCT No.: PCT/JP2021/032265
§ 371 (c)(1),
(2) Date: Jan. 17, 2023

(87) PCT Pub. No.: WO2022/074971
PCT Pub. Date: Apr. 14, 2022

(65) Prior Publication Data
US 2023/0282562 A1 Sep. 7, 2023

(30) Foreign Application Priority Data

Oct. 5, 2020 (JP) ................................. 2020-168340

(51) Int. Cl.
*H01L 23/498* (2006.01)
*H01L 23/31* (2006.01)
(Continued)

(52) U.S. Cl.
CPC ......... *H10W 70/658* (2026.01); *H10W 70/20* (2026.01); *H10W 74/131* (2026.01); *H10W 90/00* (2026.01); *H10W 90/701* (2026.01)

(58) Field of Classification Search
CPC ........... H01L 23/49844; H01L 23/3157; H01L 23/492; H01L 23/49811; H01L 25/072;
(Continued)

(56) References Cited

U.S. PATENT DOCUMENTS

2009/0236749 A1* 9/2009 Otremba ................. H01L 24/25
257/774
2013/0010446 A1* 1/2013 Henrik ................... H05K 1/185
361/783
(Continued)

FOREIGN PATENT DOCUMENTS

JP 2009-158787 A 7/2009
JP 2020-53593 A 4/2020
(Continued)

OTHER PUBLICATIONS

Office Action issued in corresponding Japanese Patent application No. 2022-555307, Jul. 1, 2025, and machine translation (8 pages).
(Continued)

*Primary Examiner* — Peniel M Gumedzoe
(74) *Attorney, Agent, or Firm* — HSML P.C.

(57) ABSTRACT

A semiconductor device includes a first and a second semiconductor elements and a wiring board. The first semiconductor element has a first electrode, a second electrode and a third electrode, and current flow between the first electrode and the second electrode is on-off controlled. The second semiconductor element has a fourth electrode, a fifth electrode and a sixth electrode, and current flow between the fourth electrode and the fifth electrode is on-off controlled. The wiring board includes a base, an obverse surface wiring layer, a reverse surface wiring layer, and a metal member inserted in the base to electrically connect the obverse surface wiring layer and the reverse surface wiring layer. The first semiconductor element and the second semiconductor element are connected in series by connecting the second electrode and the fourth electrode. The metal member is in a conduction path between the second electrode and the fourth electrode.

12 Claims, 16 Drawing Sheets

(51) Int. Cl.

| | |
|---|---|
| *H01L 23/492* | (2006.01) |
| *H01L 25/07* | (2006.01) |
| *H10W 70/20* | (2026.01) |
| *H10W 70/65* | (2026.01) |
| *H10W 74/10* | (2026.01) |
| *H10W 90/00* | (2026.01) |

(58) Field of Classification Search

CPC . H10W 70/658; H10W 70/20; H10W 90/701;
H10W 90/00

See application file for complete search history.

(56) References Cited

U.S. PATENT DOCUMENTS

| | | | |
|---|---|---|---|
| 2015/0078044 A1 | 3/2015 | Ujita et al. | |
| 2015/0223339 A1 | 8/2015 | Nakamura et al. | |
| 2017/0345714 A1* | 11/2017 | Scharf ..................... | H01L 24/36 |

FOREIGN PATENT DOCUMENTS

| | | | |
|---|---|---|---|
| JP | 2020-80348 A | 5/2020 | |
| WO | 2016/174899 A1 | 11/2016 | |
| WO | 2020/179369 A1 | 9/2020 | |

OTHER PUBLICATIONS

Office Action received in the corresponding German Patent application, Apr. 21, 2023, and English translation (12 pages).

International Search Report issued in PCT/JP2021/032265, Nov. 22, 2021 (2 pages).

Office Action issued in corresponding Japanese Patent application No. 2022-555307, Dec. 2, 2025, and machine translation (8 pages).

* cited by examiner

SEMICONDUCTOR APPARATUS

TECHNICAL FIELD

The present disclosure relates to a semiconductor device.

BACKGROUND ART

Semiconductor devices with power semiconductor elements such as MOSFETs (Metal Oxide Semiconductor Field Effect Transistors) or IGBTs (Isolated Gate Bipolar Transistors) are conventionally known. For example, a semiconductor device with two semiconductor elements connected in series is disclosed in Patent Document 1. Such a semiconductor device may be mounted on a circuit board of an electronic device and used in a power supply circuit (such as a DC/DC converter or an inverter) or a motor drive circuit, for example.

TECHNICAL REFERENCE

Patent Document
Patent Document 1: JP-A-2009-158787

SUMMARY OF THE INVENTION

Problems to be Solved by the Invention

With the recent improvement in the performance of electronic devices, semiconductor devices for use in such electronic devices are required to achieve a larger current.

The present disclosure is proposed under the above circumstances and aims to provide a semiconductor device that achieves a larger current.

Means for Solved the Problems

A semiconductor device according to the present disclosure includes: a first semiconductor element having a first electrode, a second electrode and a third electrode and configured such that current flow between the first electrode and the second electrode is on-off controlled by a first drive signal input to the third electrode; a second semiconductor element having a fourth electrode, a fifth electrode and a sixth electrode and configured such that current flow between the fourth electrode and the fifth electrode is on-off controlled by a second drive signal input to the sixth electrode; and a wiring board including a base having a base obverse surface and a base reverse surface spaced apart from each other in a thickness direction, an obverse surface wiring layer formed on the base obverse surface, a reverse surface wiring layer formed on the base reverse surface, and a metal member inserted in the base to electrically connect the obverse surface wiring layer and the reverse surface wiring layer. The first semiconductor element and the second semiconductor element are connected in series to each other by connecting the second electrode and the fourth electrode, and the metal member is in a conduction path between the second electrode and the fourth electrode.

Advantages of the Invention

The semiconductor device according to the present disclosure achieves a larger current.

MODE FOR CARRYING OUT THE INVENTION

Figure 1:
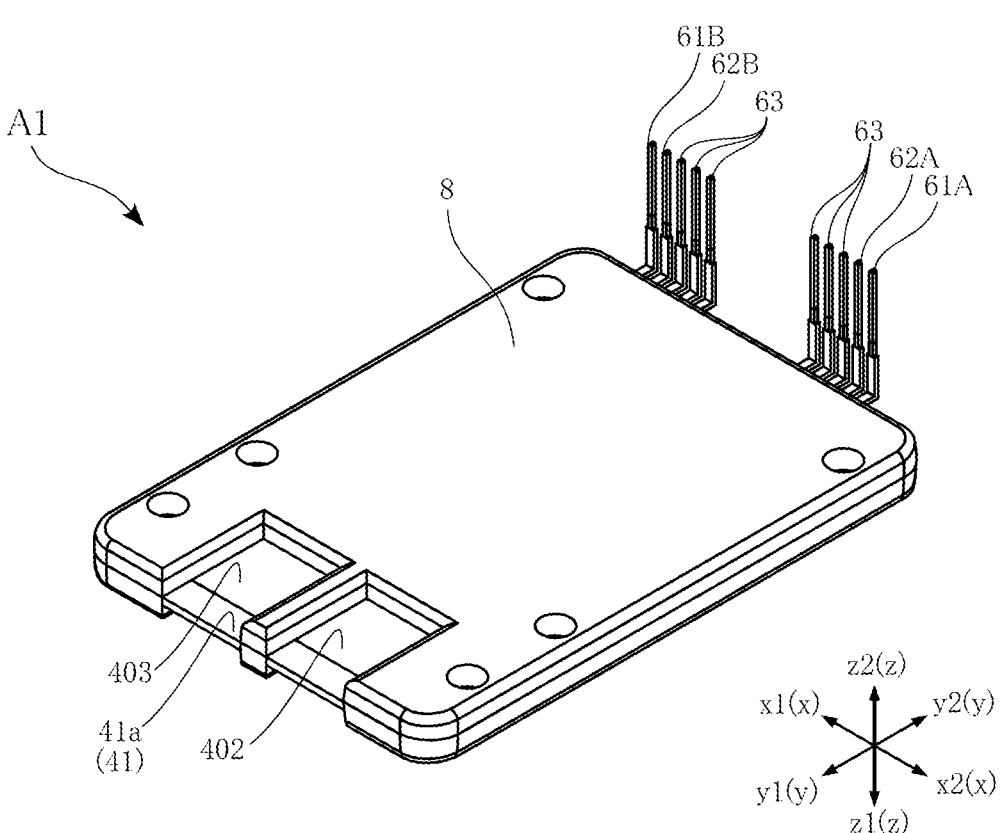
FIG. 1 is a perspective view of a semiconductor device according to a first embodiment.

Preferred embodiments of a semiconductor device according to the present disclosure are described below with reference to the accompanying drawings. The same or similar elements are denoted by the same reference signs, and the description is omitted.

FIGS. 1 to 13 show a semiconductor device A1 according to a first embodiment. The semiconductor device A1 includes a plurality of first semiconductor elements 1, a plurality of second semiconductor elements 2, a support member 3, a wiring board 4, a pair of signal terminals 61A and 61B, a pair of detection terminals 62A and 62B, a plurality of dummy terminals 63, a plurality of connection members 7 and a resin member 8. The connection members 7 include connection members 71, 72, 73A, 73B, 74A, 74B, 75A, 75B, 76A and 76B.

Figure 2:
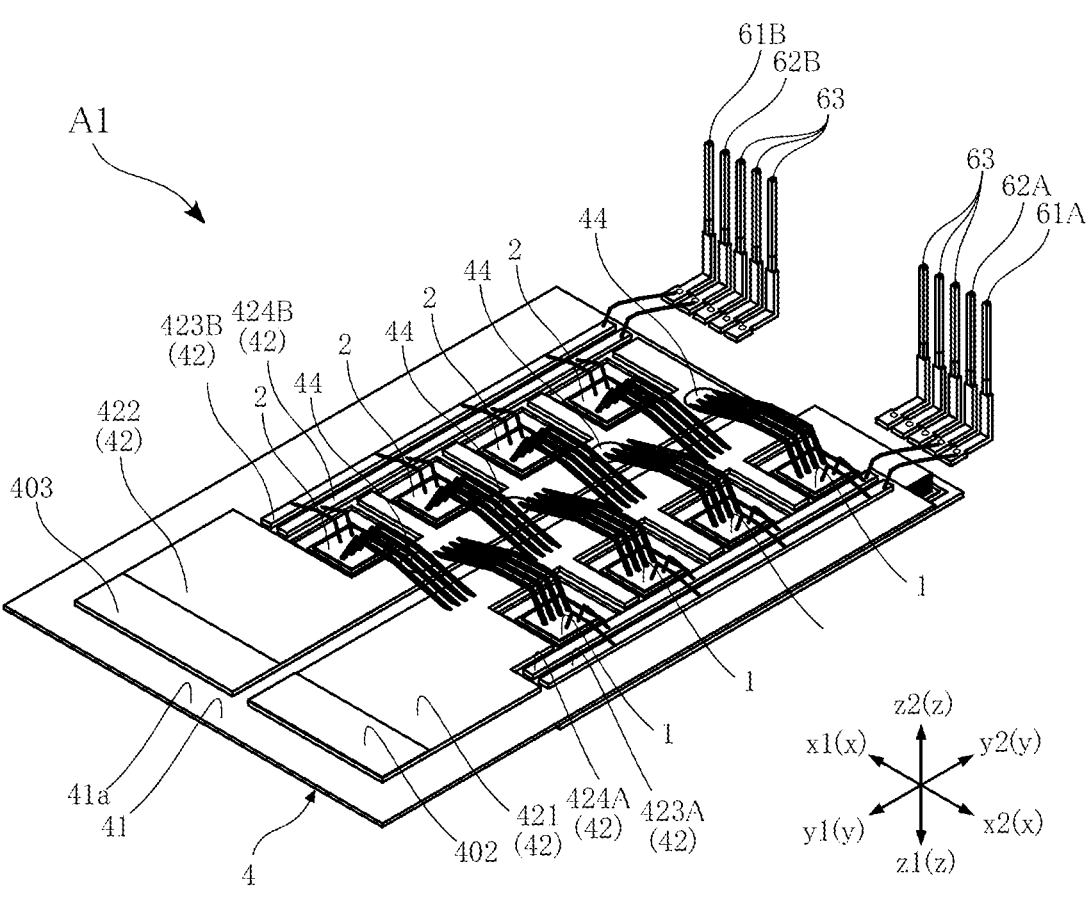
FIG. 2 is a perspective view corresponding to FIG. 1, in which a resin member is omitted.
Figure 3:
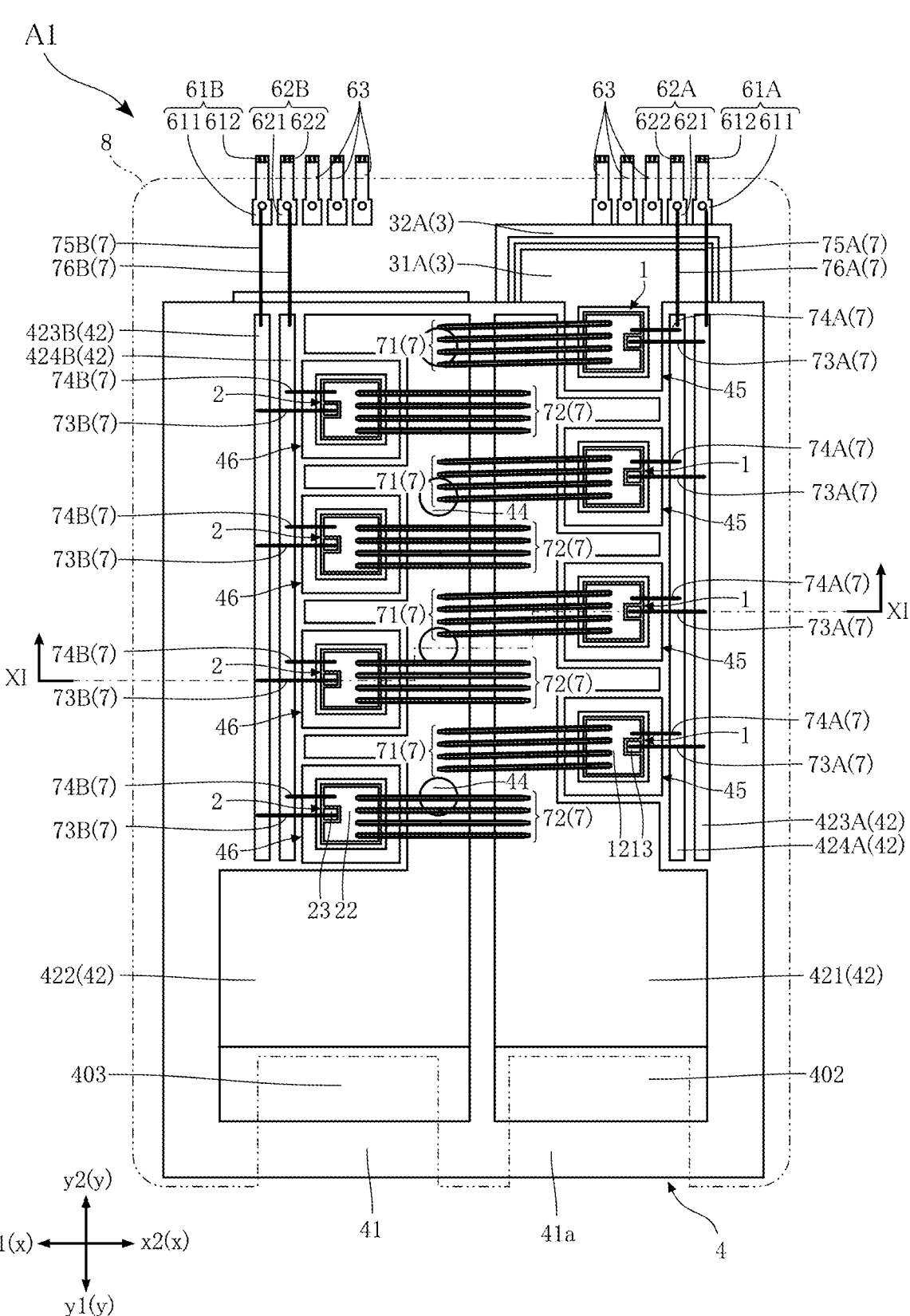
FIG. 3 is a plan view of the semiconductor device according to the first embodiment, in which the resin member is shown by imaginary lines (two-dot chain lines)
Figure 4:
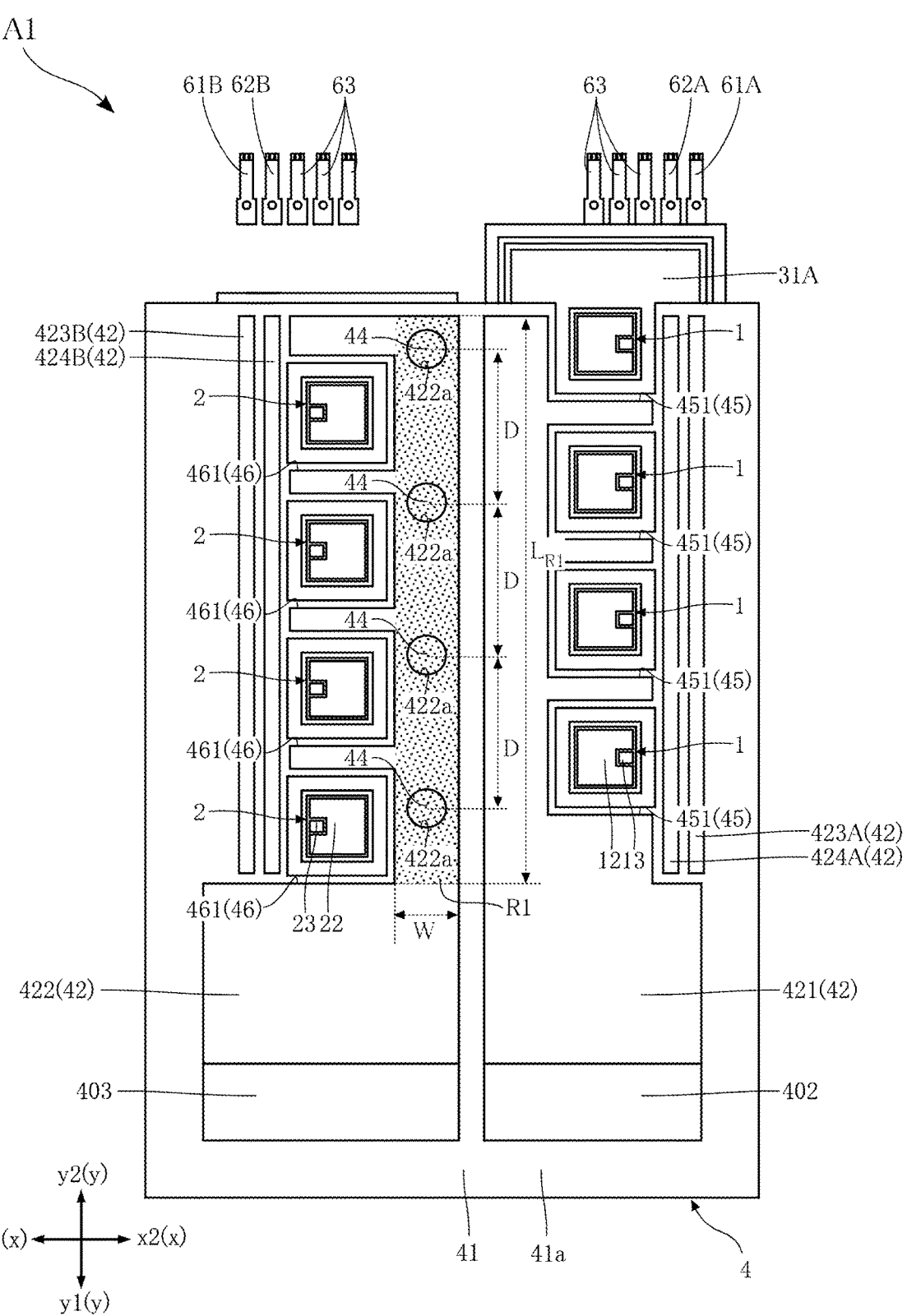
FIG. 4 is a plan view corresponding to FIG. 3, in which connection members are omitted.
Figure 5:
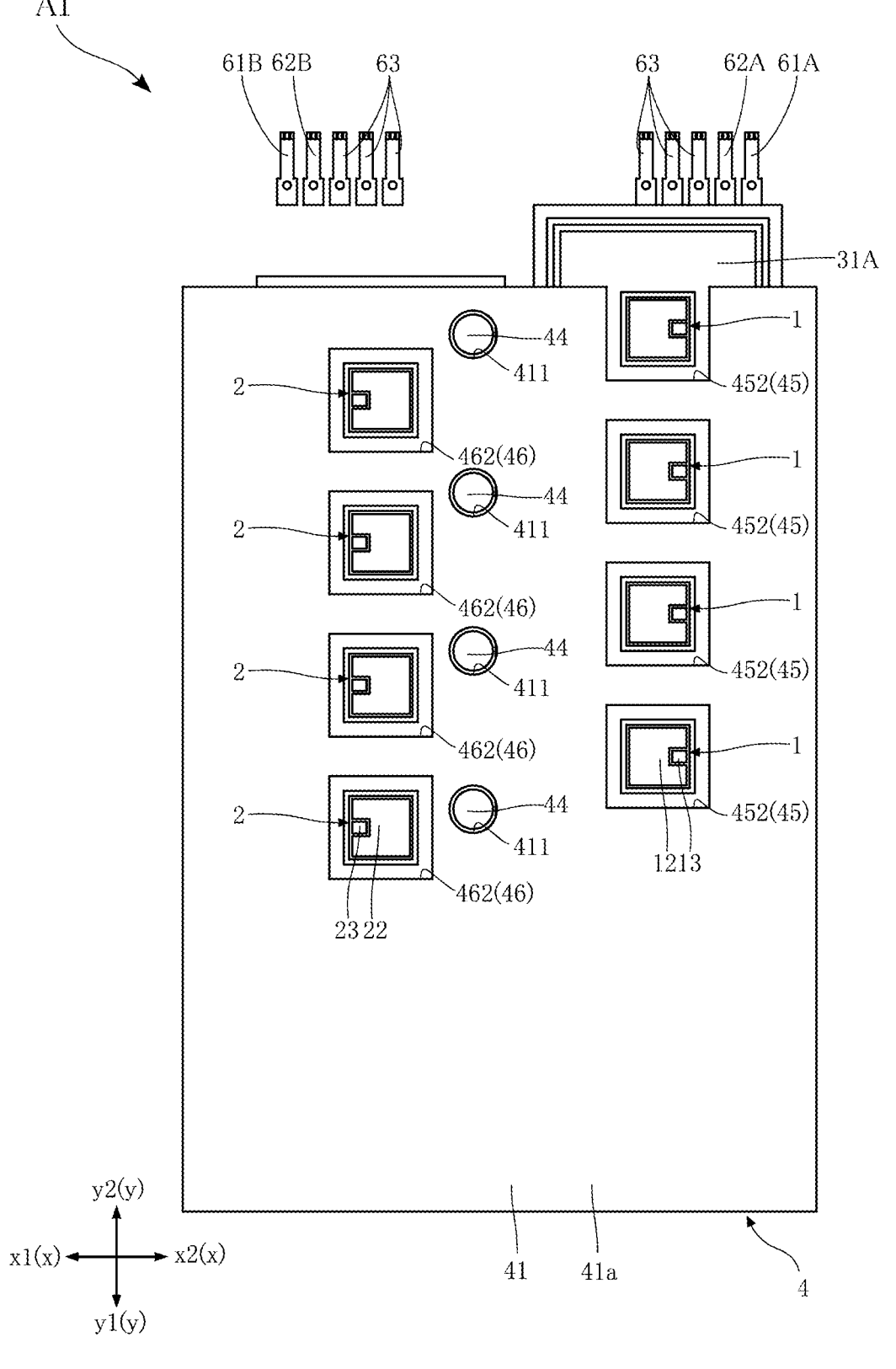
FIG. 5 is a plan view corresponding to FIG. 4, in which a part of a wiring board (an obverse surface wiring layer) is omitted.
Figure 6:
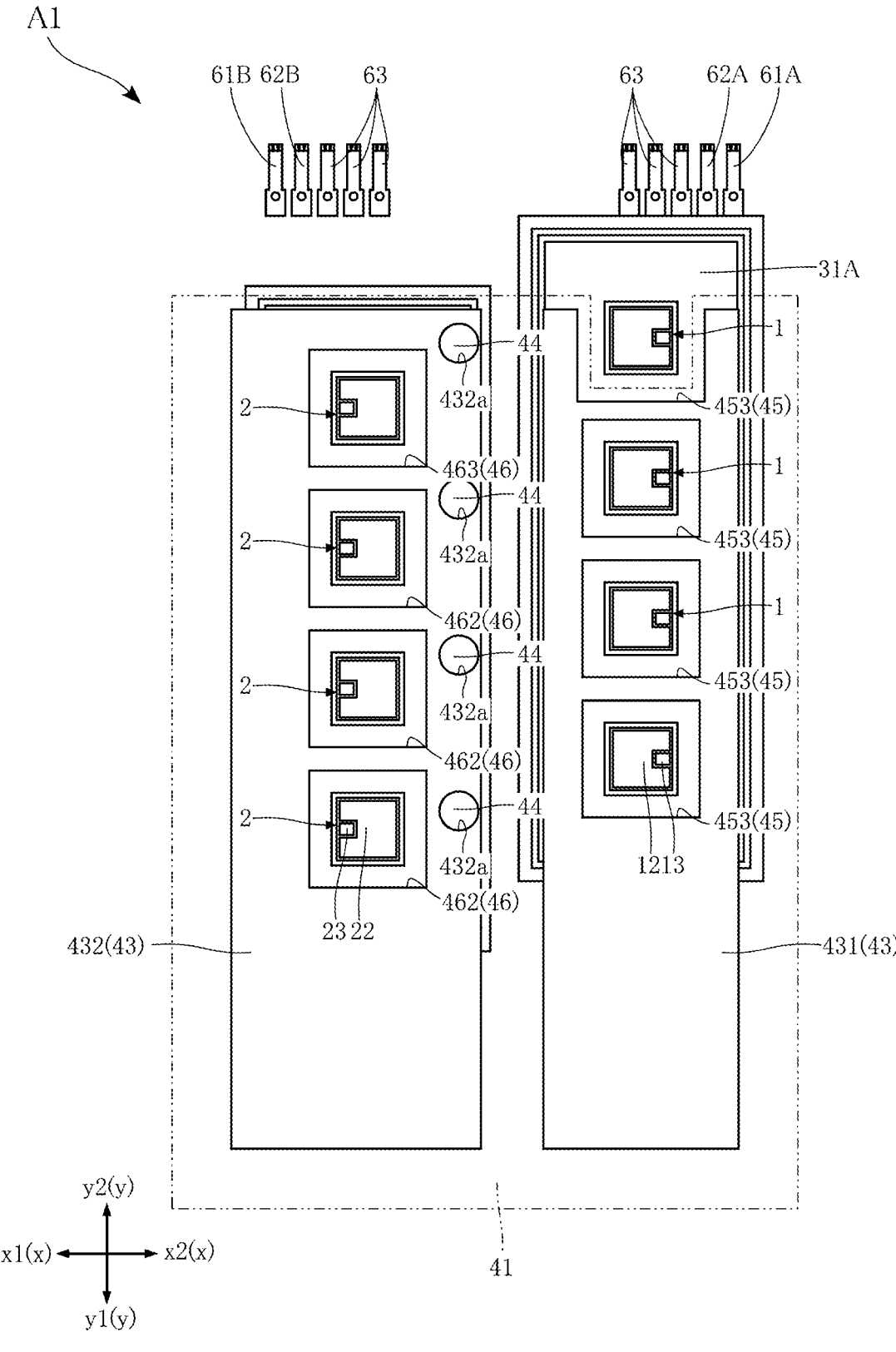
FIG. 6 is a plan view corresponding to FIG. 5, in which a part of the wiring board (a base) is omitted.
Figure 7:
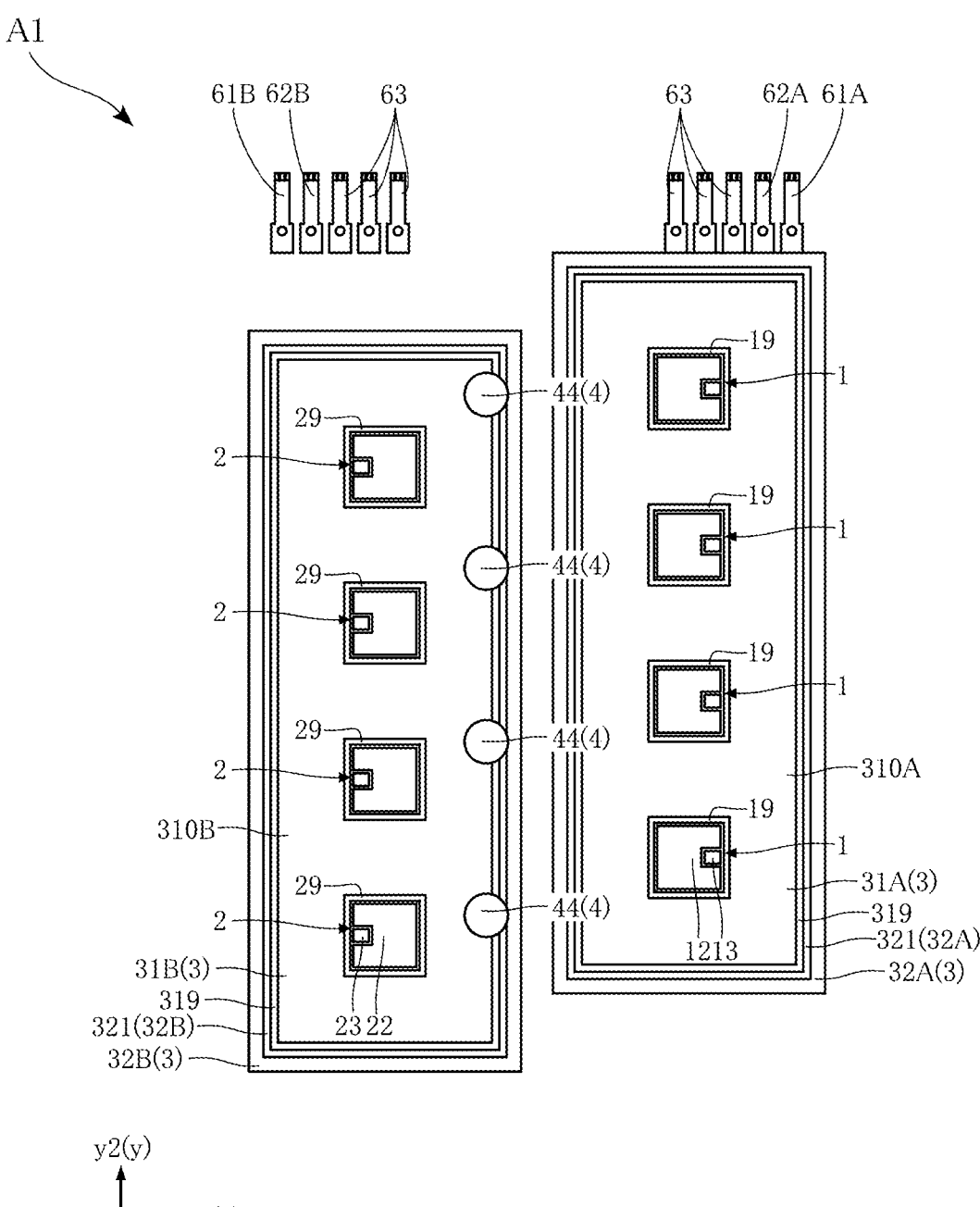
FIG. 7 is a plan view corresponding to FIG. 6, in which a part of the wiring board (a reverse surface wiring layer) is omitted.
Figure 8:
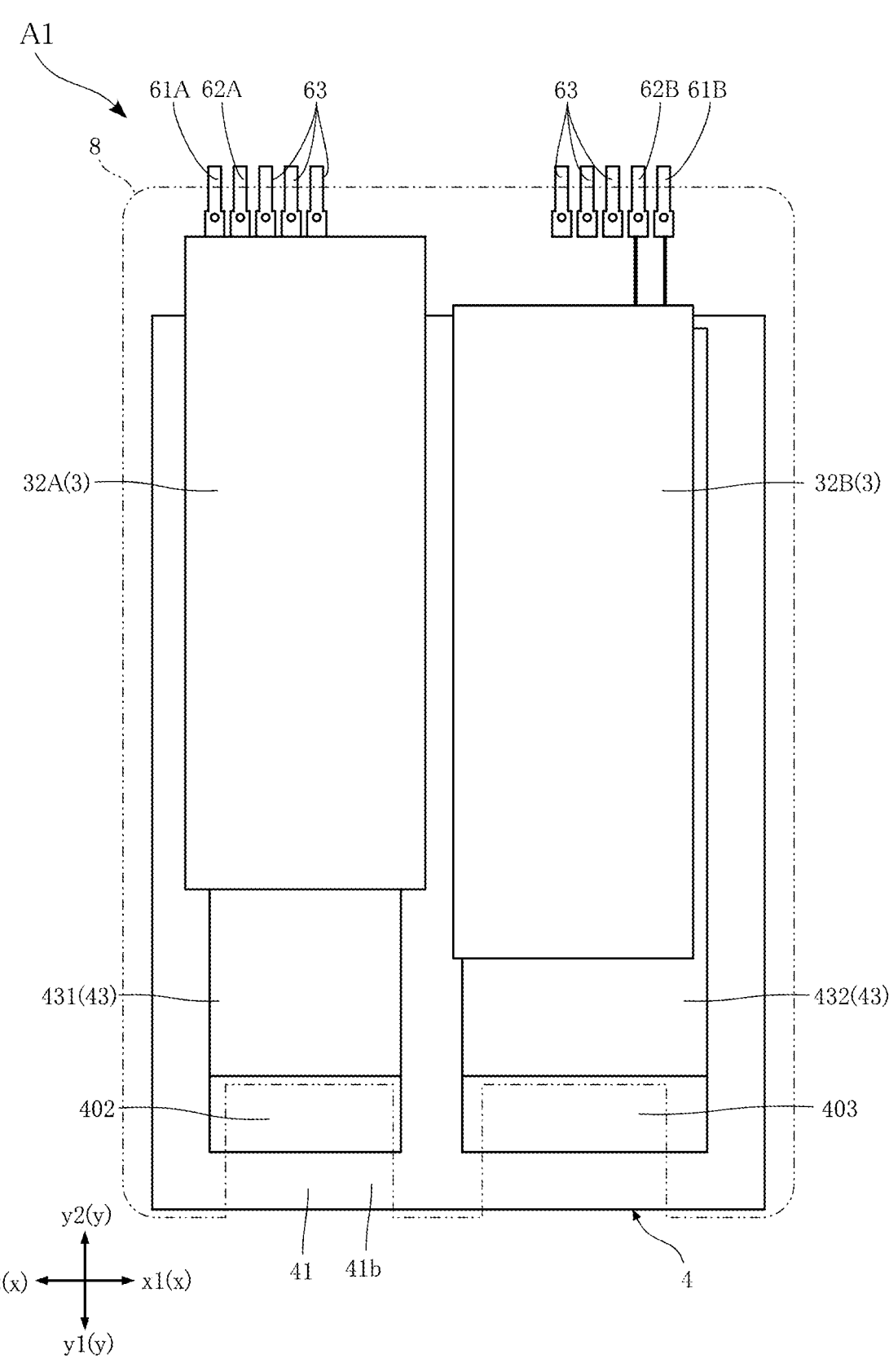
FIG. 8 is a bottom view of the semiconductor device according to the first embodiment, in which the resin member is shown by imaginary lines (two-dot chain lines)
Figure 9:
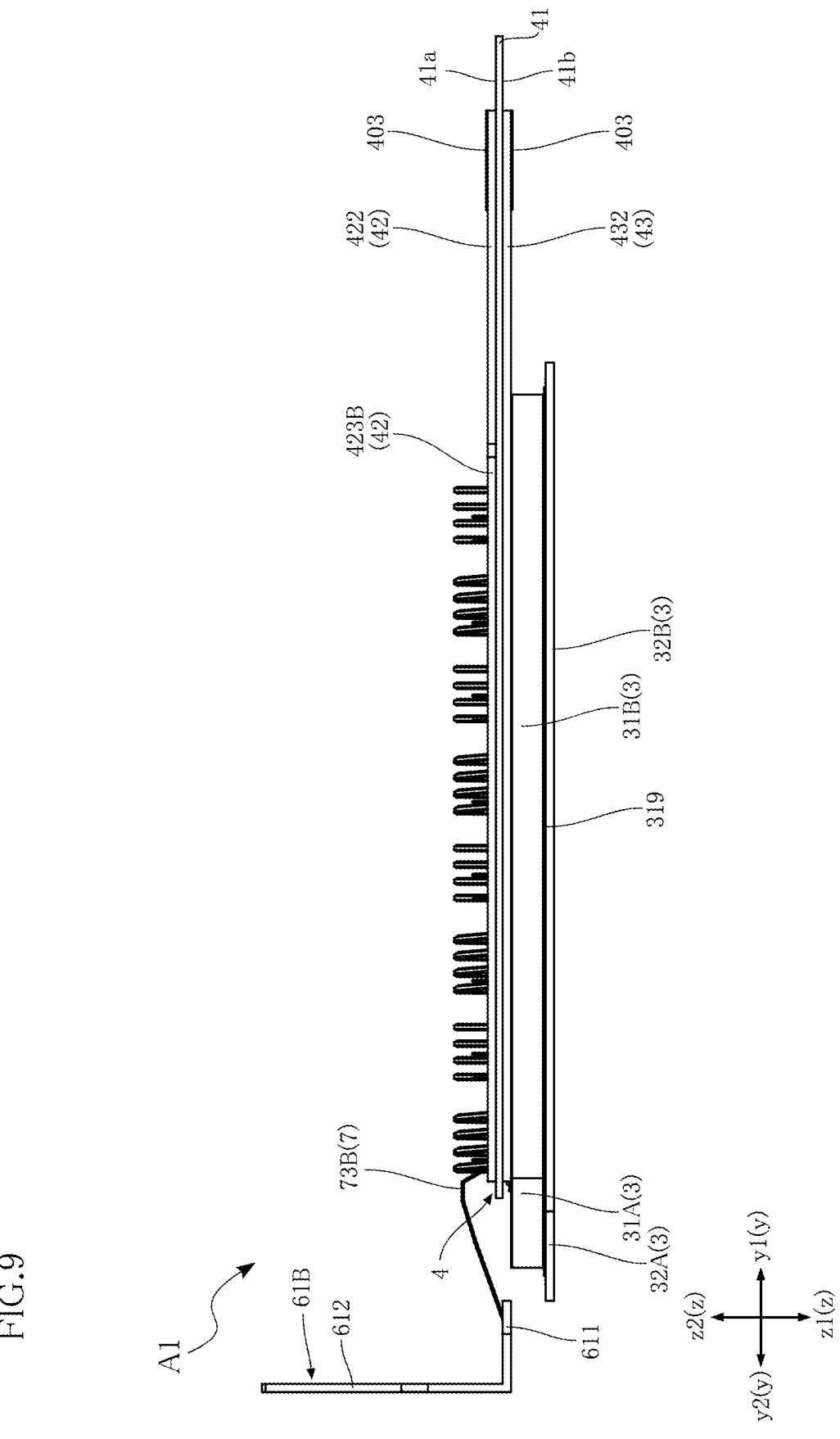
FIG. 9 is a side view (left side view) of the semiconductor device according to the first embodiment, in which the resin member is omitted.
Figure 10:
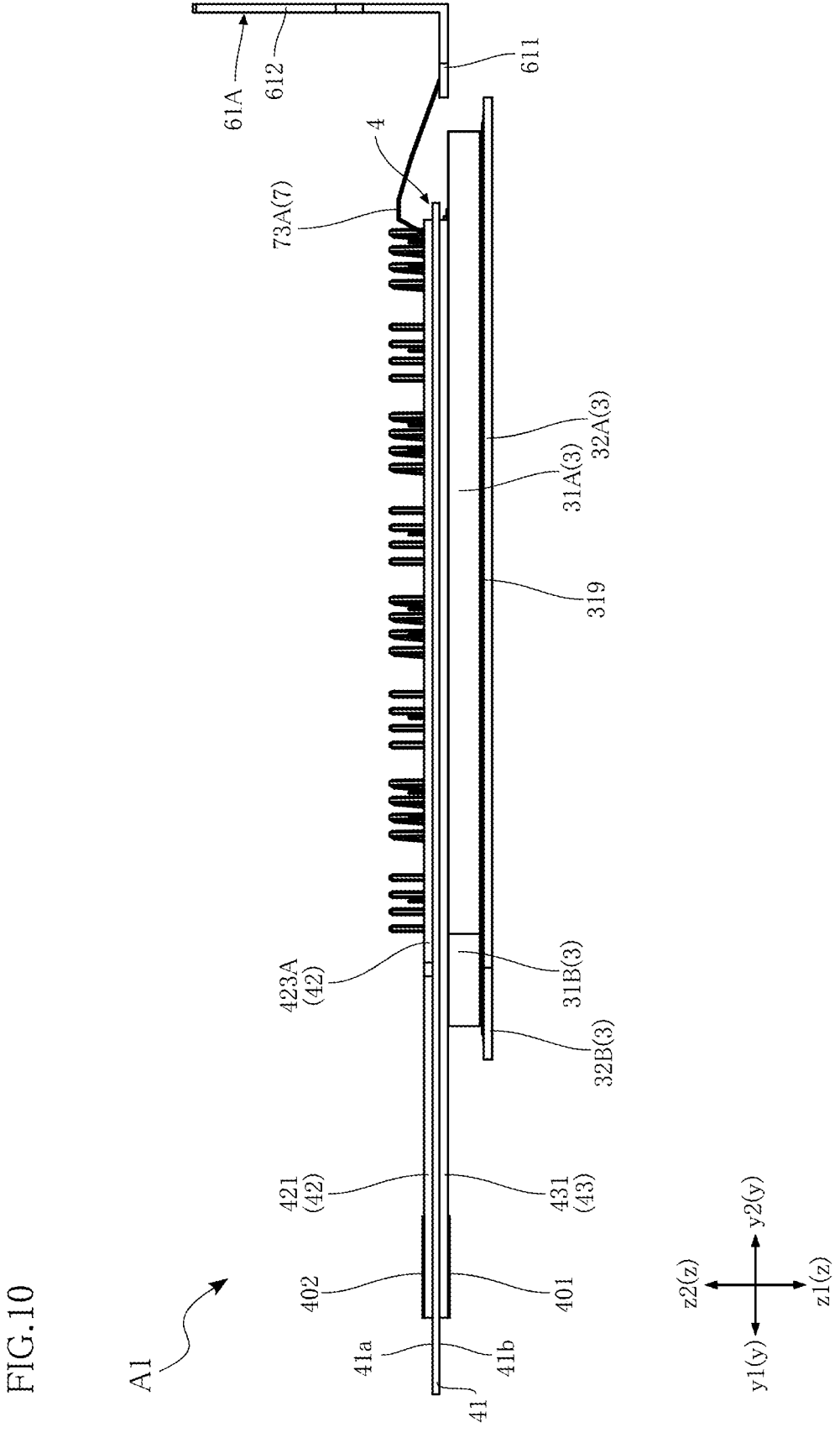
FIG. 10 is a side view (right side view) of the semiconductor device according to the first embodiment, in which the resin member is omitted.
Figure 11:
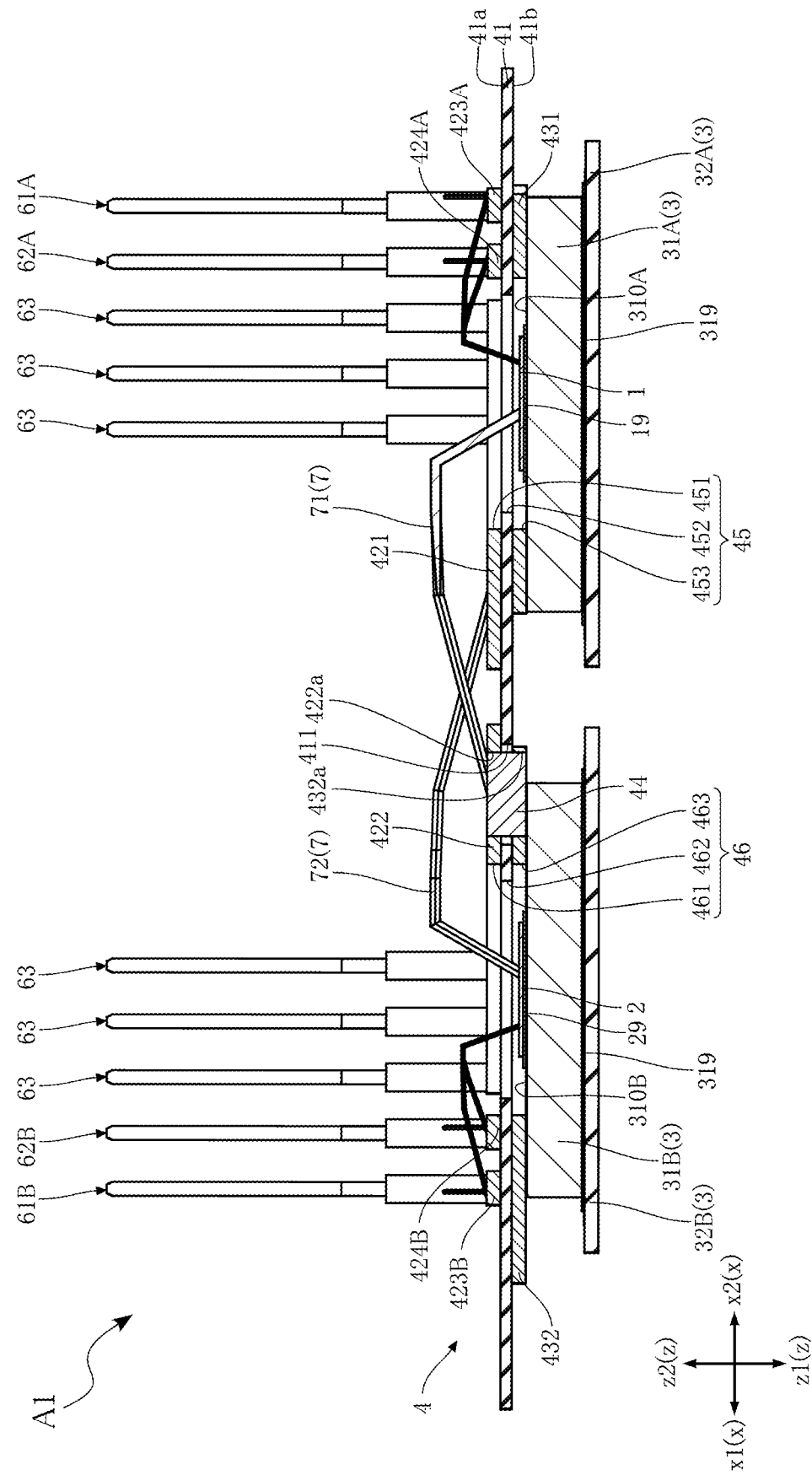
FIG. 11 is a sectional view taken along lines XI-XI in FIG. 3, in which the resin member is omitted.
Figure 12:
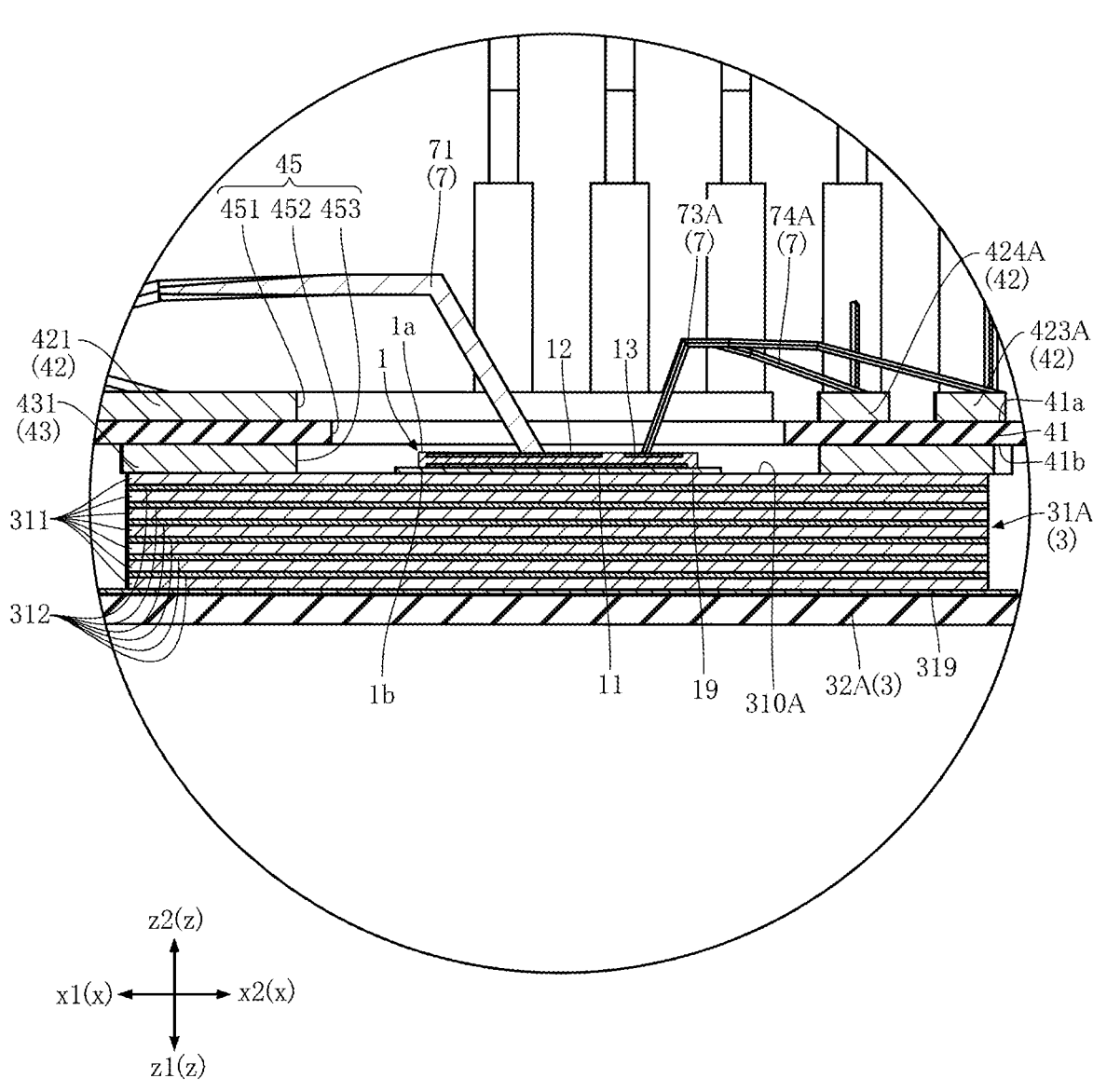
FIG. 12 is an enlarged view showing a part of FIG. 11.
Figure 13:
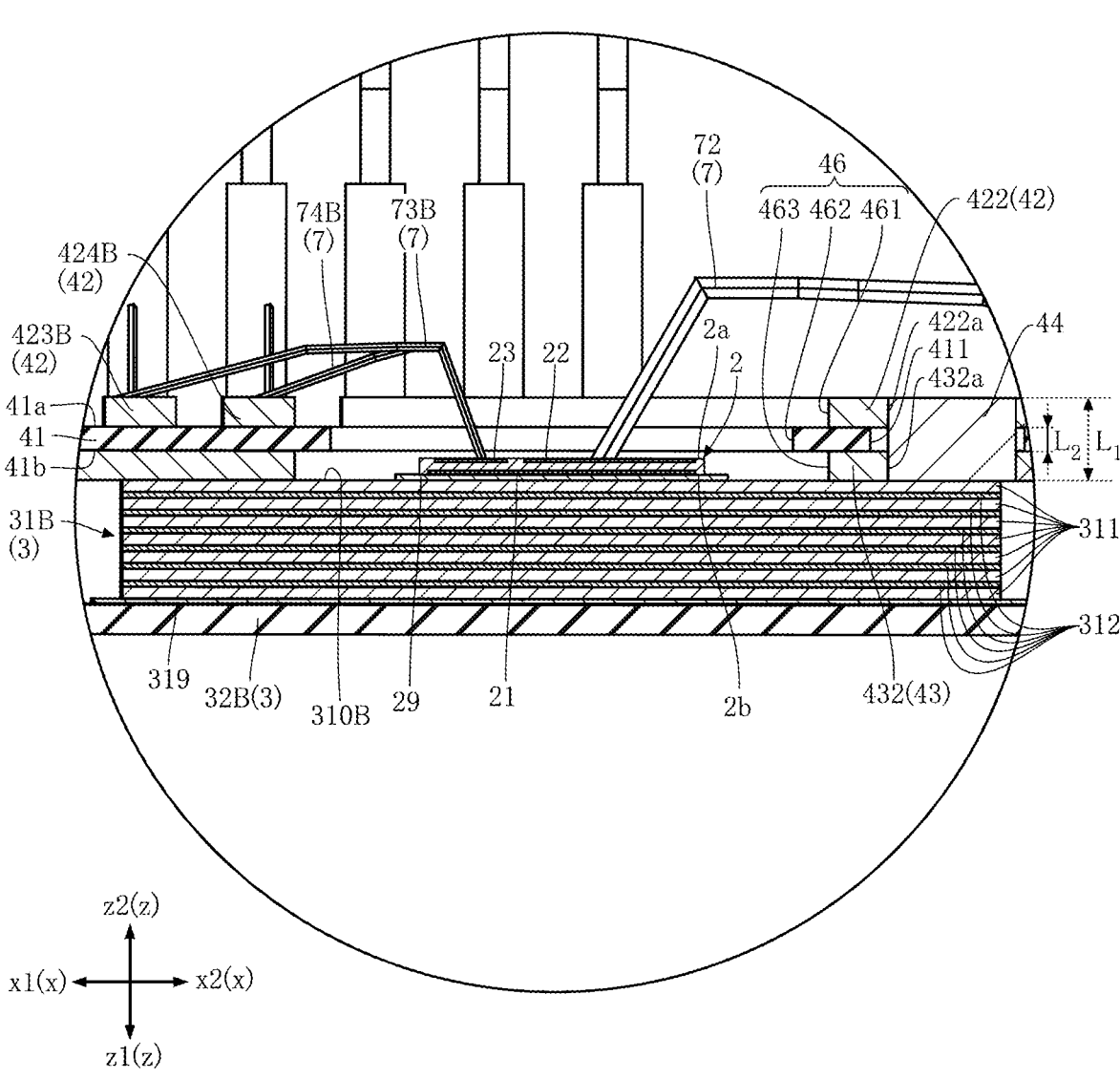
FIG. 13 is an enlarged view showing a part of FIG. 11.

FIG. 1 is perspective view of the semiconductor device A1. FIG. 2 is a perspective view corresponding to FIG. 1, in which the resin member 8 is omitted. FIG. 3 is a plan view of the semiconductor device A1, in which the resin member 8 is shown by imaginary lines (two-dot chain lines). FIG. 4 is a plan view corresponding to FIG. 3, in which the connection members 7 are omitted. FIG. 5 is a plan view corresponding to FIG. 4, in which a part of the wiring board 4 (an obverse surface wiring layer 42) is omitted. FIG. 6 is a plan view corresponding to FIG. 5, in which a part of the wiring board 4 (a base 41) is omitted. FIG. 7 is a plan view corresponding to FIG. 6, in which a part of the wiring board 4 (a reverse surface wiring layer 43) is omitted. FIG. 8 is a bottom view of the semiconductor device A1, in which the resin member 8 is shown by imaginary lines (two-dot chain lines). FIG. 9 is a side view (left side view) of the semiconductor device A1, in which the resin member 8 is omitted. FIG. 10 is a side view (right side view) of the semiconductor device A1, in which the resin member 8 is omitted. FIG. 11 is a sectional view taken along lines XI-XI in FIG. 3, in which the resin member 8 is omitted. FIG. 12 is an enlarged view showing a part of FIG. 11. FIG. 13 is an enlarged view showing a part of FIG. 11.

For convenience of explanation, three directions that are orthogonal to each other, i.e., the x direction, the y direction, and the z direction are referred to in the description below. The z direction is the thickness direction of the semiconductor device A1. The x direction is the horizontal direction in the plan view of the semiconductor device A1 (see FIG. 3). The y direction is the vertical direction in the plan view of the semiconductor device A1 (see FIG. 3). One sense of the x direction is referred to as x1 direction, and the other sense of the x direction is referred to as x2 direction. Similarly, one sense of the y direction is referred to as y1 direction, and the other sense of the y direction is referred to as y2 direction. Also, one sense of the z direction is referred to as z1 direction, and the other sense of the z direction is referred to as z2 direction. In the description below, "as viewed in plan" means "as viewed in the z direction". The x direction is an example of the "second direction", and the y direction is an example of the "first direction".

The first semiconductor elements 1 and the second semiconductor elements 2 each are a MOSFET, for example. The first semiconductor elements 1 and the second semiconductor elements 2 are not limited to MOSFETs, but may be switching elements such as field-effect transistors including MISFETs (Metal-Insulator-Semiconductor FETs) or bipolar transistors including IGBTs. The first semiconductor elements 1 and the second semiconductor elements 2 are made by using a semiconductor material mainly composed of SiC (silicon carbide). The semiconductor material is not limited to SiC, but may be Si (silicon), GaAs (gallium arsenide), GaN (gallium nitride), or $Ga_2O_3$ (gallium oxide), for example.

As shown in FIG. 12, each of the first semiconductor elements 1 has an element obverse surface 1a and an element reverse surface 1b. The element obverse surface 1a and the element reverse surface 1b are spaced apart from each other in the z direction. The element obverse surface 1a faces in the z2 direction, and the element reverse surface 1b faces in the z1 direction.

The first semiconductor elements 1 each have a first electrode 11, a second electrode 12 and a third electrode 13. As shown in FIG. 12, in each of the first semiconductor elements 1, the first electrode 11 is formed on the element reverse surface 1b, and the second electrode 12 and the third electrode 13 are formed on the element obverse surface 1a. In the example in which each of the first semiconductor elements 1 is a MOSFET, the first electrode 11 is a drain electrode, the second electrode 12 is a source electrode, and the third electrode 13 is a gate electrode. In each of the first semiconductor elements 1, when a first drive signal (e.g., gate voltage) is input to the third electrode 13 (gate electrode), the first semiconductor element 1 switches between a conducting state and a blocked state according to the first drive signal. The operation to switch between the conduction state and the blocked state is called a switching operation. In the conduction state, a current flows from the first electrode 11 (drain electrode) to the second electrode 12 (source electrode), but such a current does not flow in the blocked state. That is, in each of the first semiconductor elements 1, the current flow between the first electrode 11 (drain electrode) and the second electrode 12 (source electrode) is on-off controlled by the first drive signal (e.g., gate voltage) input to the third electrode 13 (gate electrode).

As shown in FIG. 3, the first semiconductor elements 1 are disposed along the y direction. As shown in FIG. 12, each of the first semiconductor elements 1 is bonded to a conductive plate 31A with a conductive bonding material 19. Examples of the conductive bonding material 19 include solder, metal paste and sintered metal.

As shown in FIG. 13, each of the second semiconductor elements 2 has an element obverse surface 2a and an element reverse surface 2b. The element obverse surface 2a and the element reverse surface 2b are spaced apart from each other in the z direction. The element obverse surface 2a faces in the z2 direction, and the element reverse surface 2b faces in the z1 direction.

The second semiconductor elements 2 each have a fourth electrode 21, a fifth electrode 22 and a sixth electrode 23. As shown in FIG. 13, in each of the second semiconductor elements 2, the fourth electrode 21 is formed on the element reverse surface 2b, and the fifth electrode 22 and the sixth electrode 23 are formed on the element obverse surface 2a. In the example in which each of the second semiconductor elements 2 is a MOSFET, the fourth electrode 21 is a drain electrode, the fifth electrode 22 is a source electrode, and the sixth electrode 23 is a gate electrode. In each of the second semiconductor elements 2, when a second drive signal (e.g., gate voltage) is input to the sixth electrode 23 (gate electrode), the second semiconductor element 2 performs the switching operation (i.e., switches between the conducting state and the blocked state) according to the second drive signal. In the conduction state, a current flows from the fourth electrode 21 (drain electrode) to the fifth electrode 22 (source electrode), but such a current does not flow in the blocked state. That is, in each of the second semiconductor elements 2, the current flow between the fourth electrode 21 (drain electrode) and the fifth electrode 22 (source electrode) is on-off controlled by the second drive signal (e.g., gate voltage) input to the sixth electrode 23 (gate electrode).

As shown in FIG. 3, the second semiconductor elements 2 are disposed along the y direction. The plurality of second semiconductor elements 2 overlap with the plurality of first semiconductor elements 1 as viewed in the x direction. As shown in FIG. 13, each of the second semiconductor elements 2 is bonded to a conductive plate 31B with a conductive bonding material 29. Examples of the conductive bonding material 29 include solder, metal paste and sintered metal.

The semiconductor device A1 is configured as a half-bridge switching circuit, for example. The first semiconductor elements 1 constitute an upper arm circuit of the semiconductor device A1, and the second semiconductor elements 2 constitute a lower arm circuit of the semiconductor device A1. In the semiconductor device A1, the first semiconductor elements 1 are electrically connected in parallel to each other, and the second semiconductor elements 2 are electrically connected in parallel to each other. Each of the first semiconductor elements 1 and a relevant one of the second semiconductor elements 2 are connected in series to form a bridge. In the example shown in FIG. 3, the semiconductor device A1 has four first semiconductor elements 1 and four second semiconductor elements 2. The respective numbers of the first semiconductor elements 1 and the second semiconductor elements 2 are not limited to this and may be changed as appropriate according to the performance required of the semiconductor device A1.

As shown in FIGS. 7 and 11, the support member 3 supports the first semiconductor elements 1 and the second semiconductor elements 2. As shown in FIGS. 7 and FIGS. 9 to 13, the support member 3 has a pair of conductive plates 31A, 31B and a pair of insulating plates 32A, 32B.

As shown in FIGS. 7, 11 and 12, the conductive plate 31A supports the first semiconductor elements 1. The conductive plate 31A is electrically connected to the first electrode 11 (drain electrode) of each of the first semiconductor elements 1. The conductive plate 31A may be in the form of a rectangular parallelepiped, for example. The dimension of the conductive plate 31A along the z direction is larger than the dimensions of the obverse surface wiring layer 42 and the reverse surface wiring layer 43 along the z direction. As shown in FIGS. 11 and 12, the conductive plate 31A has a bond surface 310A to which the first semiconductor elements 1 are bonded. The bond surface 310A faces in the z2 direction. In addition to the first semiconductor elements 1, a part of the wiring board 4 (a first reverse surface wiring portion 431 of the reverse surface wiring layer 43 described later) is also boded to the bond surface 310A. The conductive plate 31A is bonded to the insulating plate 32A with a bonding material 319. The bonding material 319 may be conductive or insulating.

As shown in FIGS. 7, 11 and 13, the conductive plate 31B supports the second semiconductor elements 2. The conductive plate 31B is electrically connected to the fourth electrode 21 (drain electrode) of each of the second semiconductor elements 2. The conductive plate 31B may be in the form of a rectangular parallelepiped, for example. The dimension of the conductive plate 31B along the z direction is larger than the dimensions of the obverse surface wiring layer 42 and the reverse surface wiring layer 43 along the z direction. As shown in FIGS. 11 and 13, the conductive plate 31B has a bond surface 310B on which the second semiconductor elements 2 are bonded. The bond surface 310B faces in the z2 direction. A part of the wiring board 4 (a second reverse surface wiring portion 432 of the reverse surface wiring layer 43 described later) is boded to the bond surface 310B. The conductive plate 31B is bonded to the insulating plate 32B with a bonding material 319.

As shown in FIGS. 12 and 13, each of the pair of conductive plates 31A and 31B is made up of a plurality of first metal layers 311 and a plurality of second metal layers 312 laminated in the z direction. Each of the first metal layers 311 is made of copper, for example. Each of the second metal layer 312 is made of molybdenum, for example. The respective surface layers of the conductive plate 31A and the conductive plate 31B in the z direction are first metal layers 311. As shown in FIGS. 12 and 13, in each of the conductive plates 31A and 31B, the dimension of each of the second metal layers 312 in the z direction is smaller than that of the first metal layers 311 in the z direction. Each of the conductive plates 31A and 31B is not limited to a laminate of first metal layers 311 and second metal layers 312 and may be made of a single metal.

The pair of insulating plates 32A and 32B are made of an insulating material, which may be $Al_2O_3$, for example. Each insulating plate 32A and 32B may be rectangular as viewed in plan. The insulating plate 32A supports the conductive plate 31A. The insulating plate 32B supports the conductive plate 31B. As shown in FIG. 7, the insulating plates 32A and 32B each are formed with a plating layer 321 on the surface on which the conductive plate 31A or 31B is bonded. The plating layer 321 may be made of silver or silver alloy, for example.

The wiring board 4, together with the support member 3 (conductive plates 31A, 31B) and the connection members 7, forms a conduction path in the semiconductor device A1. The wiring board 4 includes a base 41, the obverse surface wiring layer 42, the reverse surface wiring layer 43 and a plurality of metal members 44.

The base 41 is made of insulating material and may be made of a ceramic material with a high thermal conductivity in one example. Examples of such a ceramic material include AlN (aluminum nitride), SiN (silicon nitride) and $Al_2O_3$ (aluminum oxide). The base 41 is in the form of a plate that is rectangular as viewed in plan.

As shown in FIGS. 9 to 13, the base 41 has a base obverse surface 41A and a base reverse surface 41b. The base obverse surface 41A and the base reverse surface 41B are spaced apart from each other in the z direction. The base obverse surface 41A faces int the z2 direction, and the base reverse surface 41b faces in the z1 direction.

As shown in FIGS. 5, 11 and 13, the base 41 has a plurality of through-holes 411. As shown in FIGS. 11 and 13, the through-holes 411 penetrate the base 41 in the z direction from the base obverse surface 41a to the base reverse surface 41b. A metal member 44 is inserted in each of the through-holes 411. As shown in FIGS. 5, 11 and 13, the inner surface of each through-hole 411 is not in contact with the metal member 44. Unlike this, the inner surface of each through-hole 411 may be in contact with the metal member 44. Thus, in the present disclosure, "inserted" (or other similar expressions such as "put into") means that a certain member (e.g., a metal member 44) is in a certain hole (e.g., a through-hole 411), regardless of whether or not the member is in contact with the inner surface of the hole. In an example, an insulating member other than the base 41 may be provided in a gap between the metal member 44 and the inner surface of the through-hole 411.

As shown in FIG. 11, the obverse surface wiring layer 42 is formed on the base obverse surface 41a. The obverse surface wiring layer 42 is in the form of a plate made of copper or copper alloy, for example. In one example, the obverse surface wiring layer 42 is about 0.4 mm in thickness (dimension in the z direction). The thickness of the obverse surface wiring layer 42 is not limited to this, but may be changed as appropriate according to the specifications of the semiconductor device A1 (e.g., rated current and allowable current, rated voltage and breakdown voltage, the internal inductance of the entire device, the size of the device, etc.). The above-mentioned example of 0.4 mm may be selected based on the specifications such as a rated current of 600 A and the internal inductance of 4.0 nH for the entire device. When the dimensions of the obverse surface wiring layer 42 as viewed in plan are the same, a larger thickness of the obverse surface wiring layer 42 contributes more to reducing the parasitic inductance and parasitic resistance of the entire device, promoting the heat dissipation, and increasing the allowable current.

As shown in FIGS. 3,4 and 11, the obverse surface wiring layer 42 includes a first obverse surface wiring portion 421, a second obverse surface wiring portion 422, a pair of third obverse surface wiring portions 423A and 423B, and a pair of fourth obverse surface wiring portions 424A and 424B. The first obverse surface wiring portion 421, the second obverse surface wiring portion 422, the third obverse surface wiring portions 423A and 423B, and the fourth obverse surface wiring portions 424A and 424B are spaced apart from each other.

As shown in FIGS. 3 and 11, the first obverse surface wiring portion 421 is electrically connected to the fifth electrodes 22 (source electrodes) of the second semiconductor elements 2 with a plurality of connection members 72.

As shown in FIGS. 3 and 11, the second obverse surface wiring portion 422 is electrically connected to the second electrodes 12 (source electrodes) of the first semiconductor elements 1 with a plurality of connection members 71. As shown in FIGS. 3 and 4, the second obverse surface wiring portion 422 is located on the x1 side of the first obverse surface wiring portion 421.

As shown in FIGS. 4, 11 and 13, the second obverse surface wiring portion 422 has a plurality of through-holes 422a. As shown in FIGS. 11 and 13, the through-holes 422a penetrate the second obverse surface wiring portion 422 in the z direction. A metal member 44 is fitted in each of the through-holes 422a. As shown in FIGS. 4, 11 and 13, the inner surface of each through-hole 422a is in contact with the metal member 44. In the present disclosure, "fitted in" means that a certain member (e.g., a metal member 44) is in a certain hole (e.g., a through-hole 422a) and that the member is in contact with the inner surface of the hole. That is, while the "inserted" state refers to situations in a broader sense, the "fitted in" state exclusively refers to a certain member being in contact with the inner surface of a hole.

As shown in FIG. 3, the third obverse surface wiring portion 423A is electrically connected to the third electrodes 13 (gate electrodes) of the first semiconductor elements 1 with the connection members 73A. As shown in FIG. 3, the third obverse surface wiring portion 423B is electrically connected to the sixth electrodes 23 (gate electrodes) of the second semiconductor elements 2 with the connection members 73B. The third obverse surface wiring portions 423A and 423B each are in the form of a strip extending in the y direction.

As shown in FIG. 3, the fourth obverse surface wiring portion 424A is electrically connected to the second electrodes 12 (source electrodes) of the first semiconductor elements 1 with the connection members 74A. As shown in FIG. 3, the fourth obverse surface wiring portion 424B is electrically connected to the fifth electrodes 22 (source electrodes) of the second semiconductor elements 2 with the connection members 74B. The fourth obverse surface wiring portions 424A and 423B each are in the form of a strip extending in the y direction. As shown in FIGS. 3 and 4, as viewed in plan, the fourth obverse surface wiring portion 424A is disposed generally parallel to the third obverse surface wiring portion 423A. In the example shown in FIGS. 3 and 4, in the x direction, the third obverse surface wiring portion 423A and the first semiconductor elements 1 are located opposite to each other across the fourth obverse surface wiring portion 424A. As viewed in plan, the fourth obverse surface wiring portion 424B is disposed generally parallel to the third obverse surface wiring portion 423B. In the example shown in FIGS. 3 and 4, in the x direction, the third obverse surface wiring portion 423B and the second semiconductor elements 2 are located opposite to each other across the fourth obverse surface wiring portion 424B.

As shown in FIG. 11, the reverse surface wiring layer 43 is formed on the base reverse surface 41b. The reverse surface wiring layer 43 is in the form of a plate made of copper or copper alloy, for example. The thickness (dimension in the z direction) of the reverse surface wiring layer 43 is the same as that of the obverse surface wiring layer 42, which is about 0.4 mm in one example. The thickness of the reverse surface wiring layer 43 is not limited to this, but may be changed as appropriate according to the specifications of the semiconductor device A1 (e.g., rated current and allowable current, rated voltage and breakdown voltage, the internal inductance of the entire device, the size of the device, etc.). As with the obverse surface wiring layer 42, the above-mentioned example of 0.4 mm may be selected based on the specifications such as a rated current of 600 A and the internal inductance of 4.0 nH for the entire device.

As shown in FIGS. 6 and 11, the reverse surface wiring layer 43 includes a first reverse surface wiring portion 431 and a second reverse surface wiring portion 432. The first reverse surface wiring portion 431 and the second reverse surface wiring portion 432 are spaced apart from each other.

As shown in FIGS. 11 and 12, the first reverse surface wiring portion 431 is bonded to the bond surface 310A of the conductive plate 31A. The first reverse surface wiring portion 431 is electrically connected to the first electrode 11 (drain electrode) of each of the first semiconductor elements 1 via the conductive plate 31A. As will be understood from FIGS. 3, 6 and 11, the first reverse surface wiring portion 431 overlaps with the first obverse surface wiring portion 421, as viewed in plan.

As shown in FIGS. 11 and 13, the second reverse surface wiring portion 432 is bonded to the bond surface 310B of the conductive plate 31B. The second reverse surface wiring portion 432 is electrically connected to the fourth electrode 21 (drain electrode) of each of the second semiconductor elements 2 via the conductive plate 31B. As will be understood from FIGS. 3, 6 and 11, the second reverse surface wiring portion 432 overlaps with the second obverse surface wiring portion 422, as viewed in plan. As shown in FIG. 6, the second reverse surface wiring portion 432 is located on the x1 side of the first reverse surface wiring portion 431.

As shown in FIGS. 6, 11 and 13, the second reverse surface wiring portion 432 has a plurality of through-holes 432a. As shown in FIGS. 11 and 13, the through-holes 432a penetrate the second reverse surface wiring portion 432 in the z direction. Each of the through-holes 432a overlaps with a through-hole 411 and a through-hole 422a. A metal member 44 is fitted in each of the through-holes 432a, and the inner surface of each through-hole 432a is in contact with the metal member 44.

The metal members 44 are fitted in the wiring board 4 to electrically connect the obverse surface wiring layer 42 and the reverse surface wiring layer 43. In the semiconductor device A1, the current flowing in each metal member 44 is generally parallel to the z direction. Each metal member 44 is columnar with a circular shape as viewed in plan. The metal member 44 is not limited to circular as viewed in plan, but may be oval or polygonal as viewed in plan. Each metal member 44 is made of copper or copper alloy, for example. Each metal member 44 is about 1.2 mm in length $L_1$ (dimension in the z direction) (see FIG. 13) and about 1.5 mm in thickness (radius) as viewed in plan. The length and thickness as viewed in plan of each metal member 44 are not limited to the above-mentioned example.

Each metal member 44 is fitted in a through-hole 422a of the second obverse surface wiring portion 422 and a through-hole 432a of the second reverse surface wiring portion 432, and inserted in a through-hole 411 of the base 41. Each metal member 44 is in contact with the inner surface of the through-hole 422a and the inner surface of the through-hole 432a. Each metal member 44 is supported by being fitted in a through-hole 422a of the second obverse surface wiring portion 422 and a through-hole 432a of the second reverse surface wiring portion 432. When a gap is formed between each metal member 44 and the inner surfaces of the through-holes 422a and 432a, solder may be poured into the gap. Thus, the gap is filled with solder, and each metal member 44 is fixed to the wiring board 4. Note that when solder is poured, the gap between each metal member 44 and the inner surface of the through-hole 411 of the base 41 may also be filled with solder. Each metal member 44 electrically connects the second obverse surface wiring portion 422 of the obverse surface wiring layer 42 and the second reverse surface wiring portion 432 of the reverse surface wiring layer 43.

The metal members 44 are disposed in the region R1 shown in FIG. 4 and located between the first semiconductor elements 1 and the second semiconductor elements 2 as viewed in plan. That is, the region R1 is located between the first semiconductor elements 1 and the second semiconductor elements 2 as viewed in plan. The metal members 44 are arranged in a row along the y direction at almost the center of the region R1 in the x direction. In the semiconductor device A1, the region R1 has a dimension W (see FIG. 4) along the x direction of about 5 mm and a dimension $L_{R1}$ (see FIG. 4) along the y direction of about 45 mm. In the region R1, the metal members 44 are arranged at a same pitch in a row along the y-direction. The distance D (see FIG. 4) between the centers of two adjacent ones of the metal members 44 as viewed in plan is set to be not less than a specified value. Herein, the specified value is the value at which the mutual inductance between the two adjacent metal members 44 becomes almost 0 (zero), and is about 0.3 mm when each metal member 44 is about 1.2 mm in length $L_1$ and the obverse surface wiring layer 42 and the reverse surface wiring layer 43 are about 0.4 mm in thickness (dimension in the z direction). Specifically, when the mutual inductance between two metal members 44 is M, the path length of the current flowing through each metal member 44 along the z-direction is $L_2$ (see FIG. 13), and the center-to-center distance as viewed in plan between two adjacent metal members 44 is D, the formula (1) below holds. As shown in FIG. 13, the path length $L_2$ is obtained by subtracting the respective thicknesses (dimensions in the z direction) of the obverse surface wiring layer 42 and the reverse surface wiring layer 43 from the length $L_1$ of each metal member 44. From the formula (1), formula (2) below is obtained. Thus, setting the above-mentioned center-to-center distance D as viewed in plan to satisfy the formula (2) below allows the mutual inductance M to be held at almost 0 (zero). In the semiconductor device A1, the path length $L_2$ is about 0.4 mm (=1.2 (the length $L_1$)−0.4 (the thickness of the obverse surface wiring layer 42)−0.4 (the thickness of the reverse surface wiring layer 43)). Thus, to keep the mutual inductance M at almost 0 (zero), the above-mentioned specified value should be about 0.3 mm (≈0.74×0.4 mm). In the semiconductor device A1, the center-to-center distance D as viewed in plan between two adjacent metal members 44 is about 12 mm, which is larger than the specified value (about 0.3 mm). Thus, the mutual inductance between two adjacent metal members 44 is almost 0 (zero).

$$M \text{ is proportional to } (\propto)L_2 \times (\ln(2L_2/D)-1) \tag{1}$$

$$D \text{ is not smaller than } (\geq)2L_2/e(\approx 0.74 \times L_2) \tag{2}$$

To allow the plurality of metal members 44 to be disposed within the region R1 (the dimension W in the x direction×the dimension $L_{R1}$ in the y direction), the upper limit of the center-to-center distance D of two adjacent metal members 44 as viewed in plan is determined according to the number of the metal members 44. Specifically, when the number of the metal members 44 is n and the thickness (radius) of each metal member 44 as viewed in plan is r, formula (4) below is obtained from formula (3) below. The upper limit of the center-to-center distance D as viewed in plan is determined based on the formula (4). For example, in the example in which the dimension $L_{R1}$ of the region R1 in the y direction is 45 mm and the thickness (radius) r of each metal member 44 as viewed in plan is 1.5 mm, when four metal members 44 are to be disposed within the region R1, D≤(45−2×1.5)/(4−1), i.e., D≤about 14.3 mm is obtained from the formula (4) below. That is, to dispose four metal members 44 in the region R1, the center-to-center distance D as viewed in plan needs to be not more than about 14.3 mm. Similarly, to dispose five metal members 44 in the region R1, the center-to-center distance D as viewed in plan needs to be not more than about 10.5 mm. To dispose six metal members 44 in the region R1, the center-to-center distance D as viewed in plan needs to be not more than about 8.4 mm. Thus, considering the mutual inductance M as well, the center-to-center distance D as viewed in plan may be 0.9 to 14.3 mm when four metal member 44 are to be disposed in the region R1 in the semiconductor device A1.

$$L_{R1} \text{ is not smaller than } (\geq)2r+(n-1)\times D \tag{3}$$

$$D \text{ is not greater than } (\leq)(L_{R1}-2r)/(n-1) \tag{4}$$

The wiring board 4 includes a first power terminal section 401, a second power terminal section 402 and two third power terminal sections 403. The first power terminal section 401, the second power terminal sections 402 and the two third power terminal sections 403 are spaced apart from each other.

In the semiconductor device A1, the first power terminal section 401 is a part of the first reverse surface wiring portion 431. In the example shown in FIGS. 3 and 10, the first power terminal section 401 includes an end edge of the first reverse surface wiring portion 431 on the y1 side. Since the first reverse surface wiring portion 431 is electrically connected to the first electrode 11 (drain electrode) of each of the first semiconductor elements 1 through the conductive plate 31A, the first power terminal section 401 is electrically connected to the first electrode 11 of each of the first semiconductor elements 1. The surface of the first power terminal section 401 is plated. A part of the first power terminal section 401 is exposed from the resin member 8.

In the semiconductor device A1, the second power terminal section 402 is a part of the first obverse surface wiring portion 421. In the example shown in FIGS. 8 and 10, the second power terminal section 402 includes an end edge of the first obverse surface wiring portion 421 on the y1 side. Since the first obverse surface wiring portion 421 is electrically connected to the fifth electrode 22 (source electrode) of each of the second semiconductor elements 2, the second power terminal section 402 is electrically connected to the fifth electrode 22 of each of the second semiconductor elements 2. The surface of the second power terminal section 402 is plated. The first power terminal section 401 and the second power terminal section 402 overlap with each other as viewed in plan. A part of the second power terminal section 402 is exposed from the resin member 8.

In the semiconductor device A1, one of the two third power terminal sections 403 is a part of the second obverse surface wiring portion 422, and the other of the two third power terminal sections 403 is a part of the second reverse surface wiring portion 432. In the example shown in FIGS. 3, 8 and 9, each of the third power terminal sections 403 includes an end edge of the second obverse surface wiring portion 422 or the second reverse surface wiring portion 432 on the y1 side. Since the second obverse surface wiring portion 422 and the second reverse surface wiring portion 432 are electrically connected to the second electrode 12 (source electrode) of each of the first semiconductor elements 1 and the fourth electrode 21 (drain electrode) of each of the second semiconductor elements 2, respectively, the two third power terminal sections 403 are electrically connected to the second electrode 12 (source electrode) of each of the first semiconductor elements 1 and the fourth electrode 21 (drain electrode) of each of the second semiconductor elements 2, respectively. The surface of each of the third power terminal sections 403 is plated. The two third power terminal sections 403 overlap with each other as viewed in plan. Unlike the illustrated example of the semiconductor device A1 in which the wiring board 4 has two third power terminal sections 403, the wiring board 4 may have only one of the two third power terminal sections 403. A part of each of the third power terminal sections 403 is exposed from the resin member 8.

The first power terminal section 401 and the second power terminal section 402 are connected to an external DC power supply, for example, for the application of the power supply voltage (DC voltage). The first power terminal section 401 may be the P terminal connected to the positive pole of the DC power supply, and the second power terminal 402 may be the N terminal connected to the negative pole of the DC power supply. The DC voltage applied across the first power terminal section 401 and the second power terminal section 402 is converted to AC voltage by the switching operations of the first semiconductor elements 1 and the second semiconductor elements 2. The third power terminal sections 403 output the converted voltage (AC voltage).

As shown in FIG. 3, the wiring board 4 includes a plurality of first openings 45 and a plurality of second openings 46.

Each of the first openings 45 penetrates from the obverse surface wiring layer 42 to the reverse surface wiring layer 43 in the z direction. Each of the first openings 45 houses a respective one of the first semiconductor elements 1. Each of the first openings 45 surrounds the relevant first semiconductor element 1, as viewed in plan.

As shown in FIGS. 4-6, 11 and 12, each of the first openings 45 includes an upper penetrating section 451, a middle penetrating section 452 and a lower penetrating section 453. In each of the first openings 45, the upper penetrating section 451, the middle penetrating section 452 and the lower penetrating section 453 overlap with each other, as viewed in plan.

The upper penetrating section 451 is formed in the first obverse surface wiring portion 421 and penetrates the first obverse surface wiring portion 421 in the z direction. In the example shown in FIG. 4, the upper penetrating section 451 is a cutout that is L-shaped or U-shaped as viewed in plan.

The middle penetrating section 452 is formed in the base 41 and penetrates the base 41 in the z direction. In the example shown in FIG. 5, the middle penetrating section 452 is a cutout that is U-shaped as viewed in plan or a through-hole that is rectangular as viewed in plan.

The lower penetrating section 453 is formed in the first reverse surface wiring portion 431 and penetrates the first reverse surface wiring portion 431 in the z direction. In the example shown in FIG. 6, the lower penetrating section 453 is a cutout that is U-shaped as viewed in plan or a through-hole that is rectangular as viewed in plan. The element obverse surface 1a of each of the first semiconductor elements 1 overlaps with the lower penetrating section 453 as viewed in a direction orthogonal to the z direction (e.g., y direction). Thus, each of the first semiconductor elements 1 does not project upward in the z direction (i.e., in the z2 direction) from the wiring board 4.

Each of the second openings 46 penetrates from the obverse surface wiring layer 42 to the reverse surface wiring layer 43 in the z direction. Each of the second openings 46 houses a respective one of the second semiconductor elements 2, and surrounds the second semiconductor element 2, as viewed in plan. The second semiconductor elements 2 are housed in the second openings 46.

As shown in FIGS. 4 to 6, 11 and 13, each of the second openings 46 includes an upper penetrating section 461, a middle penetrating section 462 and a lower penetrating section 463. In each of the second openings 46, the upper penetrating section 461, the middle penetrating section 462 and the lower penetrating section 463 overlap with each other, as viewed in plan.

The upper penetrating section 461 is formed in the second obverse surface wiring portion 422 and penetrates the second obverse surface wiring portion 422 in the z direction. In the example shown in FIG. 4, the upper penetrating section 461 is a cutout that is U-shaped as viewed in plan.

The middle penetrating section 462 is formed in the base 41 and penetrates the base 41 in the z direction. In the example shown in FIG. 5, the middle penetrating section 462 is a through-hole that is rectangular as viewed in plan.

The lower penetrating section 463 is formed in the second reverse surface wiring portion 432 and penetrates the second reverse surface wiring portion 432 in the z direction. In the example shown in FIG. 6, the lower penetrating section 463 is a through-hole that is rectangular as viewed in plan. The element obverse surface 2a of each of the second semiconductor elements 2 overlaps with the lower penetrating section 463 as viewed in a direction orthogonal to the z direction (e.g., y direction). Thus, each of the second semiconductor elements 2 does not project upward in the z direction (i.e., in the z2 direction) from the wiring board 4.

The paired signal terminals 61A and 61B, the paired detection terminals 62A and 62B, and the plurality of dummy terminals 63 are almost identical in shape. As will be understood from FIGS. 9 and 10, each of the signal terminals 61A and 61B, detection terminals 62A and 62B, and dummy terminals 63 is L-shaped as viewed in the x direction. The signal terminals 61A and 61B, detection terminals 62A and 62B, and dummy terminals 63 are disposed generally parallel to each other in the x direction, as viewed in plan. Each of the signal terminals 61A and 61B, detection terminals 62A and 62B and dummy terminals 63 is partially covered with the resin member 8 and hence supported by the resin member 8.

The signal terminal 61A is electrically connected to the third electrode 13 (gate electrode) of each of the first semiconductor elements 1 and receives a first drive signal to control the switching operation of each of the first semiconductor elements 1. The signal terminal 61B is electrically connected to the sixth electrode 23 (gate electrode) of each of the second semiconductor elements 2 and receives a second drive signal to control the switching operation of each of the second semiconductor elements 2.

Each of the signal terminals 61A and 61B includes a pad section 611 and a terminal section 612. As shown in FIG. 3, the pad section 611 of each of the signal terminals 61A and 61B is covered with the resin member 8. To the pad section 611 of the signal terminal 61A is connected the connection member 75A, which electrically connects this pad section to the third obverse surface wiring portion 423A. To the pad section 611 of the signal terminal 61B is connected the connection member 75B, which electrically connects this pad section to the third obverse surface wiring portion 423B. As shown in FIG. 3, the terminal section 612 of each of the signal terminals 61A and 61B is exposed from the resin member 8. The terminal sections 612 of the signal terminals 61A and 61B are connected to an external control device (e.g., a gate driver) to receive a first drive signal and a second drive signal (gate voltage) from the control device.

The detection terminal 62A is electrically connected to the second electrode 12 (source electrode) of each of the first semiconductor elements 1, and the voltage applied to the second electrode 12 of each of the first semiconductor elements 1 (voltage corresponding to the source current) is output to this terminal. The detection terminal 62B is electrically connected to the fifth electrode 22 (source electrode) of each of the second semiconductor elements 2, and the voltage applied to the fifth electrode 22 of each of the second semiconductor elements 2 (voltage corresponding to the source current) is output to this terminal.

Each of the detection terminals 62A and 62B includes a pad section 621 and a terminal section 622. As shown in FIG. 3, the pad section 621 of each of the detection terminals 62A and 62B is covered with the resin member 8. To the pad section 621 of the detection terminal 62A is connected the connection member 76A, which electrically connects this pad section to the fourth obverse surface wiring portion 424A. To the pad section 621 of the detection terminal 62B is connected the connection member 76B, which electrically connects this pad section to the fourth obverse surface wiring portion 424B. As shown in FIG. 3, the terminal section 622 of each of the detection terminals 62A and 62B is exposed from the resin member 8. The terminal section 622 of each of the detection terminals 62A and 62B is connected to an external control device (e.g., a gate driver) and outputs a detection signal (source signal) to the control device.

Each of the dummy terminals 63 is not electrically connected to any of the other components of the semiconductor device A1. A part of each dummy terminal 63 is covered with the resin member 8, and the remaining part of each dummy terminal is exposed from the resin member 8.

The connection members 7 each electrically connect two mutually separated parts. As shown in FIGS. 2 and 3, in one example, each of the connection members 7 may be a bonding wire. Unlike this example, some of the connection members 7 may not be a bonding wire but may be a metal plate. The connection members 7 may be made of any of gold, aluminum and copper. As mentioned before, the connection members 7 include connection members 71, 72, 73A, 73B, 74A, 74B, 75A, 75B, 76A, 76B.

As shown in FIG. 3, the connection members 71 are bonded to the second electrodes 12 (source electrodes) of the first semiconductor elements 1 and the second obverse surface wiring portion 422 to electrically connect these to each other. In the example shown in FIG. 3, some of the connection members 71 may be connected to any of the metal members 44, rather than to the second obverse surface wiring portion 422.

As shown in FIG. 3, the connection members 72 are bonded to the fifth electrodes 22 (source electrodes) of the second semiconductor elements 2 and the first obverse surface wiring portion 421 to electrically connect these to each other.

As shown in FIG. 3, the connection members 73A are bonded to the third electrodes 13 (gate electrodes) of the first semiconductor elements 1 and the third obverse surface wiring portion 423A to electrically connect these to each other. As shown in FIG. 3, the connection members 73B are bonded to the sixth electrodes 23 (gate electrodes) of the second semiconductor elements 2 and the third obverse surface wiring portion 423B to electrically connect these to each other.

As shown in FIG. 3, the connection members 74A are bonded to the second electrodes 12 (source electrodes) of the first semiconductor elements 1 and the fourth obverse surface wiring portion 424A to electrically connect these to each other. As shown in FIG. 3, the connection members 74B are bonded to the fifth electrodes 22 (source electrodes) of the second semiconductor elements 2 and the fourth obverse surface wiring portion 424B to electrically connect these to each other.

As shown in FIG. 3, the connection member 75A is bonded to the third obverse surface wiring portion 423A and the pad section 611 of the signal terminal 61A to electrically connect these to each other. As shown in FIG. 3, the connection member 75B is bonded to the third obverse surface wiring portion 423B and the pad section 611 of the signal terminal 61B to electrically connect these to each other.

As shown in FIG. 3, the connection member 76A is bonded to the fourth obverse surface wiring portion 424A and the pad section 621 of the detection terminal 62A to electrically connect these to each other. As shown in FIG. 3, the connection member 76B is bonded to the fourth obverse surface wiring portion 424B and the pad section 621 of the detection terminal 62B to electrically connect these to each other.

The resin member 8 covers the first semiconductor elements 1, the second semiconductor elements 2, the support member 3, a part of the wiring board 4, a part of each of the signal terminals 61A and 61B, a part of each of the detection terminals 62A and 62B, a part of each dummy terminal 63 and the connection members 7. The resin member 8 is made of an insulating resin material such as epoxy resin. As shown in FIG. 3, the resin member 8 is rectangular as viewed in plan. The side surface of the resin member 8 on the y1 side is formed with a cutout on each of the z1 side and the z2 side. As shown in FIGS. 1, 3 and 8, these cutouts expose the first power terminal section 401, the second power terminal section 402 and the third power terminal section 403 of the wiring board 4 from the resin member 8.

The advantages of the semiconductor device A1 are described below.

The semiconductor device A1 includes the first semiconductor elements 1, the second semiconductor elements 2 and the wiring board 4. The wiring board 4 includes the base 41, the obverse surface wiring layer 42, the reverse surface wiring layer 43 and the metal members 44. The obverse surface wiring layer 42 is formed on the base obverse surface 41a of the base 41, and the reverse surface wiring layer 43 is formed on the base reverse surface 41b of the base 41. The metal members 44 are inserted in the base 41 to electrically connect the obverse surface wiring layer 42 and the reverse surface wiring layer 43. Conventionally, for a double-sided board having wiring patterns on the upper and lower surfaces of an insulating substrate, through vias are often used to electrically connect the wiring pattern on the upper surface and the wiring pattern on the lower surface. Such through vias are formed by applying metal plating to the surfaces of through-holes penetrating a substrate, for example, and the thickness of the metal plating is limited by the size of the through-holes, etc. Thus, if the obverse surface wiring layer 42 and the reverse surface wiring layer 43 are to be electrically connected by through vias, increasing the allowable current of the current path is limited. In the semiconductor device A1, however, the obverse surface wiring layer 42 and the reverse surface wiring layer 43 are electrically connected to each other by the metal members 44 inserted in the base 41. With such a configuration, the allowable current in the conduction between the obverse surface wiring layer 42 and the reverse surface wiring layer 43 can be increased as compared with when through vias are used. In particular, in the semiconductor device A1, a metal member 44 is present in the conduction path between the second electrode 12 (e.g., the source electrode) of the first semiconductor element 1 and the fourth electrode 21 (e.g., the drain electrode) of the second semiconductor element 2. This allows increasing the current between the second electrode 12 (source electrode) of the first semiconductor element 1 and the fourth electrode 21 (drain electrode) of the second semiconductor element 2. In this way, by using metal members 44 to electrically connect the obverse surface wiring layer 42 and the reverse surface wiring layer 43, the semiconductor device A1 can increase the allowable current in the main current path. The main current in the semiconductor device A1 is the current flowing between the first power terminal section 401, the second power terminal section 402 and the third power terminal section 403. This means the semiconductor device A1 can achieve a large current.

In the semiconductor device A1, the wiring board 4 has a plurality of metal members 44. The metal members 44 are disposed in such a manner that the center-to-center distance D between two adjacent metal members 44 as viewed in plan is not less than a specified value. Such a configuration allows the mutual inductance between two adjacent metal members 44 to be almost 0 (zero). In the semiconductor device A1, since the above-mentioned path length $L_2$ is about 0.4 mm and the center-to-center distance D between two adjacent metal members 44 as viewed in plan is about 12 mm, the mutual inductance M between two adjacent metal member 44 is almost 0 (zero), as described above. Thus, the semiconductor device A1 can reduce the internal inductance.

In the semiconductor device A1, the metal members 44 are located between the first semiconductor elements 1 and the second semiconductor elements 2, as viewed in plan. In the semiconductor device A1, the main current flows in the second obverse surface wiring portion 422, for example, and concentrates on the region R1 in the second obverse surface wiring portion 422. Disposing the metal members 44 in the region R1 secures the path for the main current. As shown in FIG. 4, the region R1 is located between the first semiconductor elements 1 and the second semiconductor elements 2, as viewed in plan. That is, disposing the metal members 44 between the first semiconductor elements 1 and the second semiconductor elements 2 as viewed in plan secures the path for the main current. In the semiconductor device A1, no metal members 44 need to be disposed in a region where the main current does not flow much (region other than region R1).

In the semiconductor device A1, the first obverse surface wiring portion 421 electrically connected to the fifth electrode 22 (source electrode) of each of the second semiconductor elements 2 and the first reverse surface wiring portion 431 electrically connected to the first electrode 11 (drain electrode) of each of the first semiconductor elements 1 are disposed opposite to each other across the base 41 in the z direction. The first reverse surface wiring portion 431 includes the first power terminal section 401, and the first obverse surface wiring portion 421 includes the second power terminal section 402. The first power terminal section 401, the second power terminal section 402, and the base 41 overlap with each other, as viewed in plan. With such a configuration, the first power terminal section 401 (first reverse surface wiring portion 431) and the second power terminal section 402 (first obverse surface wiring portion 421) form a laminated wiring structure, which reduces the inductance between the first power terminal section 401 and the second power terminal section 402. Thus, the semiconductor device A1 can reduce the internal inductance. Moreover, when an external power supply device, a bus bar or a capacitor, for example, is to be connected to the first power terminal section 401 and the second power terminal section 402, such connection can be made by sandwiching the first and second power terminal sections 401 and 402.

In the semiconductor device A1, each of the first semiconductor elements 1 is mounted on the conductive plate 31A. The conductive plate 31A functions as a heat spreader that diffuses the heat from the first semiconductor elements 1. Such a configuration improves heat dissipation as compared with when the first semiconductor elements 1 are bonded to the wiring board 4 (e.g., the obverse surface wiring layer 42). Similarly, each of the second semiconductor elements 2 is mounted on the conductive plate 31B. The conductive plate 31B functions as a heat spreader that diffuses the heat from the second semiconductor elements 2. Such a configuration improves heat dissipation as compared with when the second semiconductor elements 2 are bonded to the wiring board 4 (e.g., the obverse surface wiring layer 42).

In the semiconductor device A1, the conductive plate 31A is a laminate of first metal layers 311 made of copper and second metal layers 312 made of molybdenum. Molybdenum has a lower coefficient of linear expansion than copper. Thus, thermal expansion of the conductive plate 31A is reduced. This reduces the thermal stress applied by the heat from the first semiconductor elements 1, which are bonded to the conductive plate 31A, to the conductive bonding material 19. Since the conductive plate 31B is also a laminate of the first metal layers 311 and the second metal layers 312, thermal expansion of the conductive plate 31B is also reduced. This reduces the thermal stress applied by the heat from the second semiconductor elements 2, which are bonded to the conductive plate 31B, to the conductive bonding material 29. Thus, the semiconductor device A1 can prevent detachment of the first semiconductor elements 1 and the second semiconductor elements 2.

In the semiconductor device A1, the wiring board 4 constitutes a part of the main current path. The wiring board 4 is a double-sided board including the base 41, the obverse surface wiring layer 42 and the reverse surface wiring layer 43. The semiconductor device A1 having such a configuration can reduce the size as viewed in plan, as compared with a conventional semiconductor device (e.g., Patent Document 1).

In the semiconductor device A1, each of the first semiconductor elements 1 is housed in a respective one of the first openings 45 and overlaps with the wiring board 4 as viewed in a direction orthogonal to the z direction (e.g., as viewed in the y direction). Also, each of the second semiconductor elements 2 is housed in a respective one of the second openings 46 and overlaps with the wiring board 4 as viewed in a direction orthogonal to the z direction (e.g., as viewed in the y direction). With such a configuration, the wiring board 4 can be bonded to the conductive plates 31A and 31B without interfering with the first semiconductor elements 1 and the second semiconductor elements 2. Thus, the semiconductor device A1 can reduce the height (the dimension in the z direction).

Figure 14:
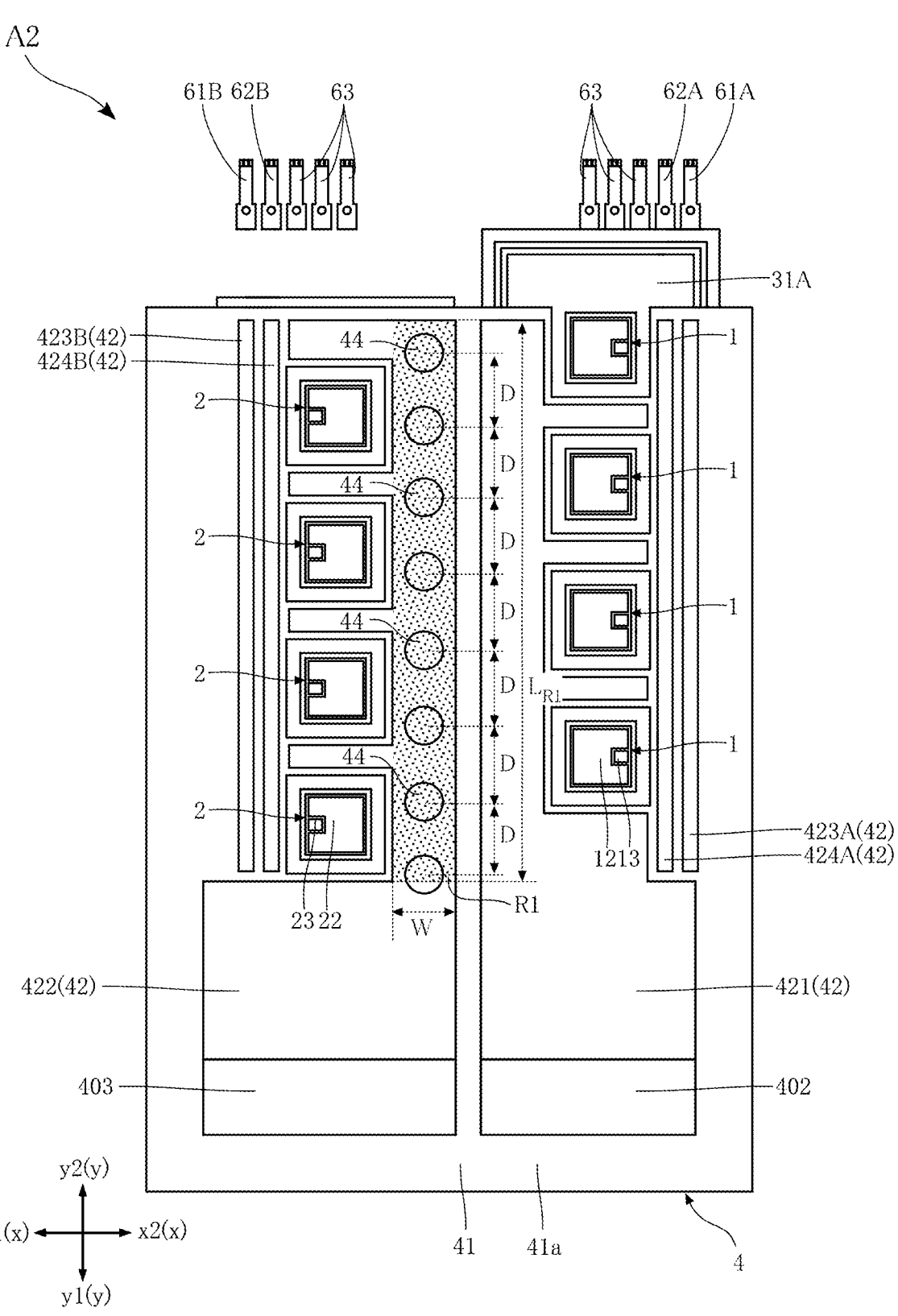
FIG. 14 is a plan view showing a semiconductor device according to a second embodiment and corresponds to FIG. 4.

FIG. 14 shows a semiconductor device A2 according to a second embodiment. FIG. 14 is a plan view showing the semiconductor device A2 and corresponds to FIG. 4 of the first embodiment. That is, FIG. 14 omits the connection members 7 and the resin member 8. The semiconductor device A2 differs from the semiconductor device A1 in that the semiconductor device A2 has a larger number of metal members 44.

As shown in FIG. 14, the wiring board 4 of the semiconductor device A2 has eight metal members 44. In the example shown in FIG. 14, the eight metal members 44 are disposed at a same pitch in a row along the y-direction. In the semiconductor device A2, the metal members 44 are disposed at a pitch of 4.5 mm, for example. That is, the center-to-center distance D as viewed in plan of two adjacent metal members 44 is about 4.5 mm. The length and thickness of each metal member 44 of the semiconductor device A2 are the same as those of each metal member 44 of the semiconductor device A1. Also, the dimension W along the x direction and the dimension $L_{R1}$ along the y direction of the region R1 are the same as those of the region R1 of the semiconductor device A1. In the semiconductor device A2, the center-to-center distance D as viewed in plan of two adjacent metal members 44 is set to about 4.5 mm, which is larger than the specified value (about 0.3 mm) mentioned above. Thus, the mutual inductance M between two adjacent metal members 44 is almost 0 (zero).

In the semiconductor device A2, the combined inductance of the self-inductances of the metal members 44 is within 5% of the internal inductance of the entire semiconductor device A2. For example, when the internal inductance of the entire semiconductor device A2 is 4 nH, 5% of it is 0.2 nH (=4 [nH]×(5/100) [%]). In this case, when the self-inductance of each metal member 44 is 1 nH, the combined inductance of the self-inductances of the metal members 44 can be held within 5% of the internal inductance of the entire semiconductor device A2 by disposing five or more metal members 44. Note that since the metal members 44 are electrically connected in parallel to each other, the combined inductance of the metal members 44 is obtained by calculating the sum of the reciprocals of the self-inductances of the metal members 44 and then taking the reciprocal of the sum. Since the number of the metal members 44 is eight in the semiconductor device A2, the combined inductance of the metal members 44 is within 5% of the internal inductance of the entire semiconductor device A2. Note that the number of metal members 44 may be changed as appropriate according to, for example, the internal inductance of the entire semiconductor device A2, the desired ratio of the combined inductance to the internal inductance, and the self-inductance of each metal member 44.

In the semiconductor device A2 again, to allow the plurality of metal members 44 to be disposed within the region R1, the upper limit of the center-to-center distance D as viewed in plan of two adjacent metal members 44 is determined based on the formula (3) and formula (4) described above. In the example in which the dimension $L_{R1}$ of the region R1 in the y direction is 45 mm and the thickness (radius) r of each metal member 44 as viewed in plan is 1.5 m, when the number n of the metal members 44 is five, D≤10.5 mm is obtained from the formula (4) above. That is, to dispose five metal members 44 in the region R1, the center-to-center distance D as viewed in plan needs to be not more than 10.5 mm. Since eight metal members 44 are disposed in the semiconductor device A2, the center-to-center distance D as viewed in plan is set to be not more than 6 mm.

The semiconductor device A2 has the same advantages as the semiconductor device A1.

The semiconductor device A2 has a larger number of metal members 44 than the semiconductor device A1. Thus, the combined inductance of the metal members 44 is reduced, so that the semiconductor device A2 can reduce the internal inductance as compared with the semiconductor device A1. In particular, in the semiconductor device A2, the combined inductance of the self-inductances of the metal members 44 is within 5% of the internal inductance of the entire semiconductor device A2. The combined inductance reduces as the number of metal members 44 increases. However, there are physical limitations on the number of metal members 44 that can be disposed in the region R1. Specifically, the number is limited to less than or equal to the calculated value on the right side of the formula (5) below, which is obtained from the formula (3) described above. That is, the upper limit of the number n of the metal members 44 is determined based on the formula (5) below. Note that in the semiconductor device A2 again, the center-to-center distance D as viewed in plan is set to hold the mutual inductance M at almost 0 (zero).

$$n \text{ is not greater than } (\leq)((L_{R1}-2r)/D)+1 \tag{5}$$

Figure 15:
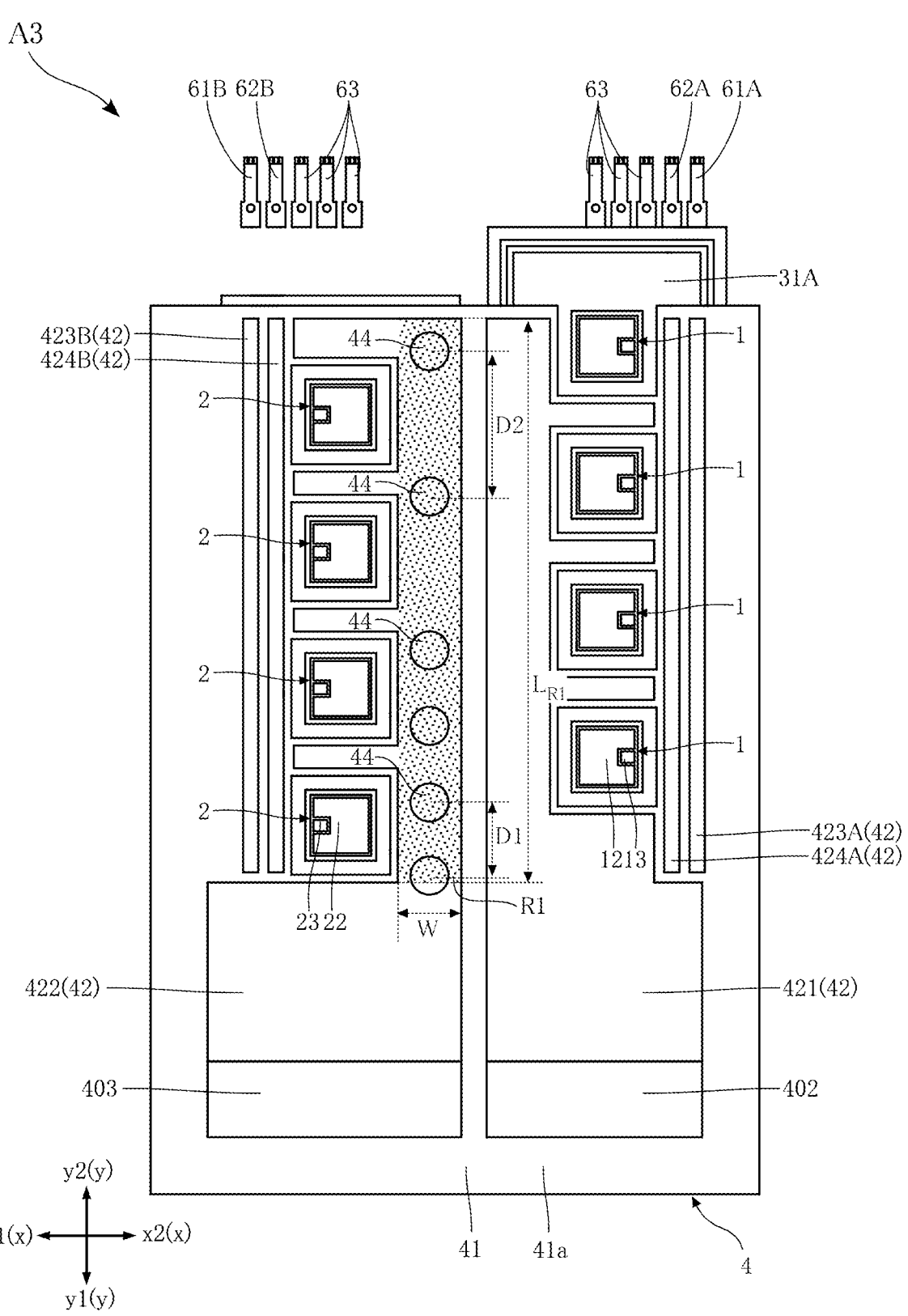
FIG. 15 is a plan view showing a semiconductor device according to a third embodiment and corresponds to FIG. 4.

FIG. 15 shows a semiconductor device A3 according to a third embodiment. FIG. 15 is a plan view showing the semiconductor device A3 and corresponds to FIG. 4 of the first embodiment. That is, FIG. 15 omits the connection members 7 and the resin member 8. The semiconductor device A3 differs from the semiconductor device A1 in that the metal members 44 are not arranged at a same pitch.

As shown in FIG. 15, as with the semiconductor devices A1 and A2, the metal members 44 of the semiconductor device A3 are arranged in a row along the y direction. In the semiconductor device A3, however, as shown in FIG. 15, the center-to-center distance D1 as viewed in plan between two adjacent ones of the metal members 44 located on the y1 side is smaller than the center-to-center distance D2 as viewed in plan between two adjacent metal members 44 located on the y2 side. That is, the spacing between adjacent metal members 44 is smaller on the y1 side than on the y2 side, so that the density of the metal members 44 on the y1 side in the region R1 is higher than the density of the metal members 44 on the y2 side in the region R1. The metal members 44 may be arranged in such a manner that the above-mentioned spacing gradually becomes smaller from the y1 side toward the y2 side, as viewed in plan. Note that the center-to-center distance D1 as viewed in plan is not less than the above-mentioned specified value to make the mutual inductance M between two metal member 44 almost 0 (zero).

The semiconductor device A3 has the same advantages as the semiconductor devices A1 and A2.

In the semiconductor device A3, the spacing between metal members 44 is smaller on the y1 side than on the y2 side, as viewed in plan. That is, in the semiconductor device A3, the center-to-center distance D1 as viewed in plan between two adjacent metal members 44 located on the y1 side is smaller than the center-to-center distance D2 as viewed in plan between two adjacent metal members 44 located on the y2 side. In the semiconductor device A3, the first power terminal section 401 and the second power terminal section 402 are disposed on the y1 side of the region R1. With such a configuration, in the region R1, the main current tends to concentrate on the area between a first semiconductor element 1 and a second semiconductor element 2 that are offset toward the y1 side, rather than on the area between a first semiconductor element 1 and a second semiconductor element 2 that are offset toward the y2 side. Thus, the center-to-center distance D1 as viewed in plan is set smaller than the center-to-center distance D2 as viewed in plan to allow a larger number of metal members 44 to be disposed in the area on which the main current concentrates. The semiconductor device A3 having such a configuration can increase the allowable current in the main current path. That is, the semiconductor device A3 is advantageous in achieving a large current.

The third embodiment shows the example in which center-to-center distance D1 as viewed in plan is smaller than the center-to-center distance D2 as viewed in plan. However, the present disclosure is not limited to such a configuration. For example, the thickness as viewed in plan of the metal members 44 that are offset in the y1 direction may be made larger than that of the metal members 44 that are offset in the y2 direction. Also, as viewed in plan, the thickness of the metal members 44 as viewed in plan may become gradually smaller from the y1 side to the y2 side. Since a thicker metal member 44 provides a larger allowable current, this configuration can also increase the allowable current in the main current path.

The example in which the center-to-center distance D1 as viewed in plan is smaller than the center-to-center distance D2 as viewed in plan is described in the third embodiment, but conversely, the center-to-center distance D2 may be made smaller than the center-to-center distance D1 as viewed in plan. That is, the density of the metal members 44 on the y2 side in the region R1 may be made higher than the density of the metal members 44 on the y1 side in the region R1. As mentioned before, the main current tends to concentrate on the area between a first semiconductor element 1 and a second semiconductor element 2 that are offset toward the y1 side, rather than on the area between a first semiconductor element 1 and a second semiconductor element 2 that are offset toward the y2 side. Thus, making the center-to-center distance D2 as viewed in plan smaller than the center-to-center distance D1 as viewed in plan can increase the current paths of the metal members 44 in the area that is offset toward the y2 side, which alleviates the concentration of the current on a particular area in the region R1. Thus, the imbalance of the current flow to each of the first semiconductor elements 1 and each of the second semiconductor elements 2 is reduced, which consequently prevents non-uniform degradation of the first semiconductor elements 1 and the second semiconductor elements 2. In the present variation again, the thicknesses of the metal members 44 as viewed in plan may be made different, rather than making the center-to-center distance D1 as viewed in plan and the center-to-center distance D2 as viewed in plan different. That is, the metal members 44 that are offset in the y2 direction may have a larger thickness as viewed in plan than the metal members 44 that are offset in the y1 direction.

The first through the third embodiments show the example in which the metal members 44 are disposed at almost the center of the region R1 in the x direction in a row along the y direction. However, the present disclosure is not limited to such a configuration, and the metal members may be offset toward the edge of the region R1 on the x1 side (or the x2 side). Due to the switching operations of the first semiconductor elements 1 and the second semiconductor elements 2, an alternating current flows in the region R1 (the second obverse surface wiring portion 422 and the second reverse surface wiring portion 432). An alternating current having a higher frequency is more likely to flow to the surface of a conductor due to the skin effect. Thus, the above configuration allows the metal members 44 to be disposed in the area where the alternating current is more likely to flow within the region R1 (the second obverse surface wiring portion 422 and the second reverse surface wiring portion 432).

Figure 16:
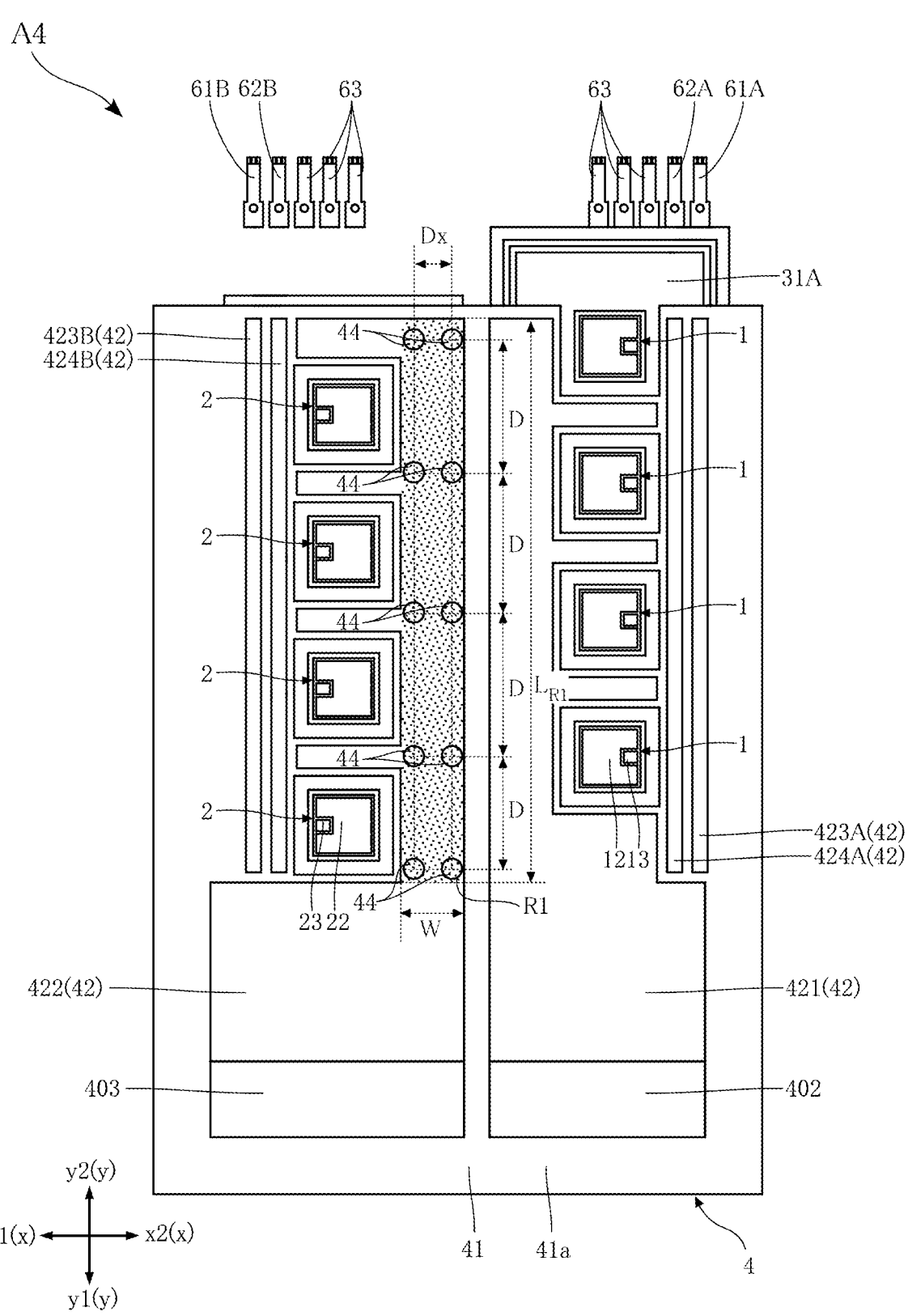
FIG. 16 is a plan view showing a semiconductor device according to a fourth embodiment and corresponds to FIG. 4.

FIG. 16 shows a semiconductor device A4 according to a fourth embodiment. FIG. 16 is a plan view showing the semiconductor device A4 and corresponds to FIG. 4 of the first embodiment. That is, FIG. 16 omits the connection members 7 and the resin member 8. The semiconductor device A4 differs from the semiconductor device A1 in that the metal members 44 are not arranged in one row but arranged in a plurality of rows along the y direction. In the example shown in FIG. 16, the metal members 44 aligned in the y direction are disposed in two rows spaced apart from each other in the x direction. The two rows of the metal members 44 may be equally spaced in the x direction in the region R1 or may be offset, in view of the skin effect, toward opposite edges in the x direction.

In the semiconductor device A1, the dimension W of the region R1 along the x direction is about 5 mm, and the thickness (radius) of each metal member 44 as viewed in plan is about 1.5 mm, so that only one row can be disposed in the x direction. In the semiconductor device A4, therefore, the thickness (radius) as viewed in plan of each metal member 44 is made smaller than that in the semiconductor device A1, which makes it possible to dispose in the region of the same dimension W a plurality of rows spaced in the x direction. Note that in the semiconductor device A4, in view of the mutual inductance M between two adjacent metal members 44, the center-to-center distance D as viewed in plan between two metal members 44 adjacent to each other in the y direction is set to be not less than the specified value, and additionally, the center-to-center distance Dx as viewed in plan between two metal members 44 adjacent to each other in the x direction is also set to be not less than the specified value.

The semiconductor device A4 has the same advantages as the semiconductor device A1.

Although the first through the fourth embodiments show the example in which each metal member 44 is not in contact with the inner surface of a through-hole 411, the present disclosure is not limited to this, and each metal member may be in contact with the inner surface of a through-hole 411. That is, each metal member 44 may be fitted in a through-hole 411. With such a configuration, each metal member 44 is supported not only by the obverse surface wiring layer 42 and the reverse surface wiring layer 43 but also by the base 41, and hence, is prevented from falling out. Moreover, in the configuration in which each metal member 44 is fitted in a through-hole 411, the metal member 44 may not be fitted in the obverse surface wiring layer 42 (the second obverse surface wiring portion 422) but arranged in such a manner that the upper surface of the metal member 44 (the surface facing in the z2 direction) is in contact with the obverse surface wiring layer 42. Similarly, each metal member 44 may not be fitted in the reverse surface wiring layer 43 (the second reverse surface wiring portion 432) but arranged in such a manner that the lower surface of the metal member 44 (the surface facing in the z1 direction) is in contact with the reverse surface wiring layer 43.

The semiconductor device according to the present disclosure is not limited to the foregoing embodiments. The specific configuration of each part of the semiconductor device according to the present disclosure may be varied in design in many ways. For example, the semiconductor device according to the present disclosure includes the embodiments described in the following clauses.

Clause 1.

A semiconductor device comprising:

a first semiconductor element having a first electrode, a second electrode and a third electrode and configured such that current flow between the first electrode and the second electrode is on-off controlled by a first drive signal input to the third electrode;

a second semiconductor element having a fourth electrode, a fifth electrode and a sixth electrode and configured such that current flow between the fourth electrode and the fifth electrode is on-off controlled by a second drive signal input to the sixth electrode; and a wiring board including a base having a base obverse surface and a base reverse surface spaced apart from each other in a thickness direction, an obverse surface wiring layer formed on the base obverse surface, a reverse surface wiring layer formed on the base reverse surface, and a metal member inserted in the base to electrically connect the obverse surface wiring layer and the reverse surface wiring layer, wherein the first semiconductor element and the second semiconductor element are connected in series to each other by connecting the second electrode and the fourth electrode, and the metal member is in a conduction path between the second electrode and the fourth electrode.

Clause 2.

The semiconductor device according to clause 1, wherein the wiring board includes a first power terminal section, a second power terminal section and a third power terminal section that are spaced apart from each other, the first power terminal section is electrically connected to the first electrode, the second power terminal section is electrically connected to the fifth electrode, and the third power terminal section is electrically connected to the second electrode and the fourth electrode.

Clause 3.

The semiconductor device according to clause 2, further comprising:

a resin member that covers a part of the wiring board, the first semiconductor element and the second semiconductor element, wherein, of the wiring board, the first power terminal section, the second power terminal section and the third power terminal section are exposed from the resin member.

Clause 4.

The semiconductor device according to clause 2 or 3, wherein the obverse surface wiring layer includes a first obverse surface wiring portion and a second obverse surface wiring portion spaced apart from each other, the first obverse surface wiring portion is electrically connected to the fifth electrode, the second obverse surface wiring portion is electrically connected to the second electrode and the fourth electrode, and the second power terminal section is a part of the first obverse surface wiring portion.

Clause 5.

The semiconductor device according to clause 4, wherein the reverse surface wiring layer includes a first reverse surface wiring portion and a second reverse surface wiring portion spaced apart from each other, the first reverse surface wiring portion is electrically connected to the first electrode, the second reverse surface wiring portion is electrically connected to the second electrode and the fourth electrode, and the first power terminal section is a part of the first reverse surface wiring portion.

Clause 6.

The semiconductor device according to clause 5, wherein the second obverse surface wiring portion and the second reverse surface wiring portion are electrically connected to each other via the metal member.

Clause 7.

The semiconductor device according to clause 6, wherein the second obverse surface wiring portion includes an obverse surface through-hole penetrating in the thickness direction, the second reverse surface wiring portion includes a reverse surface through-hole penetrating in the thickness direction, and the metal member is fitted in the obverse surface through-hole and the reverse surface through-hole to be supported by the wiring board.

Clause 8.

The semiconductor device according to clause 6 or 7, wherein the first power terminal section and the second power terminal section overlap with each other as viewed in the thickness direction.

Clause 9.

The semiconductor device according to clause 8, wherein the third power terminal section is a part of the second obverse surface wiring portion or a part of the second reverse surface wiring portion.

Clause 10.

The semiconductor device according to clause 9, wherein the first semiconductor element has a first element obverse surface facing in a sense of the thickness direction in which the base obverse surface faces and a first element reverse surface facing in a sense of the thickness direction in which the base reverse surface faces, the first electrode is provided on the first element reverse surface, the second electrode is provided on the first element obverse surface, the second semiconductor element has a second element obverse surface facing in the sense of the thickness direction in which the base obverse surface faces and a second element reverse surface facing in the sense of the thickness direction in which the base reverse surface faces, the fourth electrode is provided on the second element reverse surface, and the fifth electrode is provided on the second element obverse surface.

Clause 11.

The semiconductor device according to clause 10, further comprising:

a first conductive plate having a first bond surface to which the first electrode is bonded and supporting the first semiconductor element, and a second conductive plate having a second bond surface to which the fourth electrode is bonded and supporting the second semiconductor element, wherein the first conductive plate and the second conductive plate overlap with the wiring board as viewed in the thickness direction, the first reverse surface wiring portion is bonded to the first bond surface and electrically connected to the first electrode via the first conductive plate, and the second reverse surface wiring portion is bonded to the second bond surface and electrically connected to the fifth electrode via the second conductive plate.

Clause 12.

The semiconductor device according to clause 11, wherein the wiring board includes a first opening and a second opening each penetrating from the obverse surface wiring layer to the reverse surface wiring layer in the thickness direction, the first opening surrounds the first semiconductor element as viewed in the thickness direction, and the second opening surrounds the second semiconductor element as viewed in the thickness direction.

Clause 13.

The semiconductor device according to clause 12, further comprising:

a first connection member connecting the second electrode and the second obverse surface wiring portion; and a second connection member connecting the fifth electrode and the first obverse surface wiring portion.

Clause 14.

The semiconductor device according to any of clauses 1-13, wherein a plurality of said metal members are provided, and the metal members are disposed in such a manner that a distance as viewed in the thickness direction between centers of two metal members that are adjacent to each other as viewed in the thickness direction is not less than a specified value.

Clause 15.

The semiconductor device according to clause 14, wherein a plurality of said first semiconductor elements and a plurality of said second semiconductor elements are provided, the first semiconductor elements are electrically connected in parallel to each other and arranged along a first direction orthogonal to the thickness direction, and the second semiconductor elements are electrically connected in parallel to each other and arranged along the first direction.

Clause 16.

The semiconductor device according to clause 15, wherein the first semiconductor elements and the second semiconductor elements overlap with each other as viewed in a second direction orthogonal to the thickness direction and the first direction, and the metal members are located between the first semiconductor elements and the second semiconductor elements as viewed in the thickness direction.

Clause 17.

The semiconductor device according to clause 16, wherein the metal members are arranged along the first direction.

Clause 18.

The semiconductor device according to clause 17, wherein a spacing between adjacent ones of the metal members is smaller on one side than on the other side in the first direction.

Clause 19.

The semiconductor device according to any of clauses 14-18, wherein a combined inductance of the metal members is within 5% of an inductance of an entirety of the semiconductor device.

LIST OF REFERENCE CHARACTERS

A1-A4: Semiconductor device
1: First semiconductor element
1a: Element obverse surface
1b: Element reverse surface
11: First electrode
12: Second electrode
13: Third electrode
19: Conductive bonding material
2: Second semiconductor element
2a: Element obverse surface
2b: Element reverse surface
21: Fourth electrode
22: Fifth electrode
23: Sixth electrode
29: Conductive bonding material
3: Support member
31A, 31B: Conductive plate
311: First metal layer
312: Second metal layer
319: Bonding material
310A, 310B: Bond surface
32A, 32B: Insulating plate
321: Plating layer
4: Wiring board
401: First power terminal section
402: Second power terminal section
403: Third power terminal section
41: Base
41a: Base obverse surface
41b: Base reverse surface
411: Through-hole
42: Obverse surface wiring layer
421: First obverse surface wiring portion
422: Second obverse surface wiring portion
422a: Through-hole
423A, 423B: Third obverse surface wiring portion
424A, 424B: Fourth obverse surface wiring portion
43: Reverse surface wiring layer
431: First reverse surface wiring portion
432: Second reverse surface wiring portion
432a: Through-hole
44: Metal member
45: First opening
451: Upper penetrating section
452: Middle penetrating section
453: Lower penetrating section
46: Second opening
461: Upper penetrating section
462: Middle penetrating section
463: Lower penetrating section
61A, 61B: Signal terminal
611: Pad section
612: Terminal section
62A, 62B: Detection terminal
63: Dummy terminal
621: Pad section
622: Terminal section
7, 71, 72, 73A, 73B: Connection member
74A, 74B, 75A, 75B: Connection member
76A, 76B: Connection member
8: Resin member

The invention claimed is:

1. A semiconductor device comprising:

a first semiconductor element having a first electrode, a second electrode and a third electrode and configured such that current flow between the first electrode and the second electrode is on-off controlled by a first drive signal input to the third electrode;

a second semiconductor element having a fourth electrode, a fifth electrode and a sixth electrode and configured such that current flow between the fourth electrode and the fifth electrode is on-off controlled by a second drive signal input to the sixth electrode; and a wiring board including a base having a base obverse surface and a base reverse surface spaced apart from each other in a thickness direction, an obverse surface wiring layer formed on the base obverse surface, a reverse surface wiring layer formed on the base reverse surface, a metal member inserted in the base to electrically connect the obverse surface wiring layer and the reverse surface wiring layer, and a first power terminal section, a second power terminal section and a third power terminal section that are spaced apart from each other, wherein the first semiconductor element and the second semiconductor element are connected in series to each other by connecting the second electrode and the fourth electrode, the metal member is in a conduction path between the second electrode and the fourth electrode, the first power terminal section is electrically connected to the first electrode, the second power terminal section is electrically connected to the fifth electrode, and the third power terminal section is electrically connected to the second electrode and the fourth electrode, the obverse surface wiring layer includes a first obverse surface wiring portion and a second obverse surface wiring portion spaced apart from each other, the first obverse surface wiring portion is electrically connected to the fifth electrode, the second obverse surface wiring portion is electrically connected to the second electrode and the fourth electrode, and the second power terminal section being a part of the first obverse surface wiring portion, the reverse surface wiring layer includes a first reverse surface wiring portion and a second reverse surface wiring portion spaced apart from each other, the first reverse surface wiring portion is electrically connected to the first electrode, the second reverse surface wiring portion is electrically connected to the second electrode and the fourth electrode, and the first power terminal section is a part of the first reverse surface wiring portion, the second obverse surface wiring portion and the second reverse surface wiring portion are electrically connected to each other via the metal member, and the first power terminal section and the second power terminal section overlap with each other as viewed in the thickness direction.

2. The semiconductor device according to claim 1, further comprising:

a resin member that covers a part of the wiring board, the first semiconductor element and the second semiconductor element, wherein, of the wiring board, the first power terminal section, the second power terminal section and the third power terminal section are exposed from the resin member.

3. The semiconductor device according to claim 1, wherein the second obverse surface wiring portion includes an obverse surface through-hole penetrating in the thickness direction, the second reverse surface wiring portion includes a reverse surface through-hole penetrating in the thickness direction, and the metal member is fitted in the obverse surface through-hole and the reverse surface through-hole to be supported by the wiring board.

4. The semiconductor device according to claim 1, wherein the third power terminal section is a part of the second obverse surface wiring portion or a part of the second reverse surface wiring portion.

5. The semiconductor device according to claim 4, wherein the first semiconductor element has a first element obverse surface facing in a sense of the thickness direction in which the base obverse surface faces and a first element reverse surface facing in a sense of the thickness direction in which the base reverse surface faces, the first electrode is provided on the first element reverse surface, the second electrode is provided on the first element obverse surface, the second semiconductor element has a second element obverse surface facing in the sense of the thickness direction in which the base obverse surface faces and a second element reverse surface facing in the sense of the thickness direction in which the base reverse surface faces, the fourth electrode is provided on the second element reverse surface, and the fifth electrode is provided on the second element obverse surface.

6. The semiconductor device according to claim 5, further comprising:

a first conductive plate having a first bond surface to which the first electrode is bonded and supporting the first semiconductor element, and a second conductive plate having a second bond surface to which the fourth electrode is bonded and supporting the second semiconductor element, wherein the first conductive plate and the second conductive plate overlap with the wiring board as viewed in the thickness direction, the first reverse surface wiring portion is bonded to the first bond surface and electrically connected to the first electrode via the first conductive plate, and the second reverse surface wiring portion is bonded to the second bond surface and electrically connected to the fifth electrode via the second conductive plate.

7. The semiconductor device according to claim 6, wherein the wiring board includes a first opening and a second opening each penetrating from the obverse surface wiring layer to the reverse surface wiring layer in the thickness direction, the first opening surrounds the first semiconductor element as viewed in the thickness direction, and the second opening surrounds the second semiconductor element as viewed in the thickness direction.

8. The semiconductor device according to claim 7, further comprising:

a first connection member connecting the second electrode and the second obverse surface wiring portion; and a second connection member connecting the fifth electrode and the first obverse surface wiring portion.

9. A semiconductor device comprising:

a first semiconductor element having a first electrode, a second electrode and a third electrode and configured such that current flow between the first electrode and the second electrode is on-off controlled by a first drive signal input to the third electrode;

a second semiconductor element having a fourth electrode, a fifth electrode and a sixth electrode and configured such that current flow between the fourth electrode and the fifth electrode is on-off controlled by a second drive signal input to the sixth electrode; and a wiring board including a base having a base obverse surface and a base reverse surface spaced apart from each other in a thickness direction, an obverse surface wiring layer formed on the base obverse surface, a reverse surface wiring layer formed on the base reverse surface, and a metal member inserted in the base to electrically connect the obverse surface wiring layer and the reverse surface wiring layer, wherein the first semiconductor element and the second semiconductor element are connected in series to each other by connecting the second electrode and the fourth electrode, the metal member is in a conduction path between the second electrode and the fourth electrode, wherein a plurality of said metal members are provided, the metal members are disposed in such a manner that a distance as viewed in the thickness direction between centers of two metal members that are adjacent to each other as viewed in the thickness direction is not less than a specified value, a plurality of said first semiconductor elements and a plurality of said second semiconductor elements are provided, the first semiconductor elements are electrically connected in parallel to each other and arranged along a first direction orthogonal to the thickness direction, and the second semiconductor elements are electrically connected in parallel to each other and arranged along the first direction, the first semiconductor elements and the second semiconductor elements overlap with each other as viewed in a second direction orthogonal to the thickness direction and the first direction, and the metal members are located between the first semiconductor elements and the second semiconductor elements as viewed in the thickness direction.

10. The semiconductor device according to claim 9, wherein the metal members are arranged along the first direction.

11. The semiconductor device according to claim 10, wherein a spacing between adjacent ones of the metal members is smaller on one side than on the other side in the first direction.

12. The semiconductor device according to claim 9, wherein a combined inductance of the metal members is within 5% of an inductance of an entirety of the semiconductor device.

\* \* \* \* \*